(12) United States Patent
Yamazaki et al.

(10) Patent No.: US 9,070,894 B2
(45) Date of Patent: Jun. 30, 2015

(54) LIGHT EMITTING DEVICE

(75) Inventors: Shunpei Yamazaki, Setagaya (JP);
Junichiro Sakata, Atsugi (JP); Hisao Ikeda, Atsugi (JP); Yasuo Nakamura, Machida (JP); Keiko Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/417,551

(22) Filed: Mar. 12, 2012

(65) Prior Publication Data

US 2012/0181522 A1    Jul. 19, 2012

Related U.S. Application Data

(62) Division of application No. 12/434,777, filed on May 4, 2009, now Pat. No. 8,138,667, which is a division of application No. 10/947,316, filed on Sep. 23, 2004, now Pat. No. 7,541,734.

(30) Foreign Application Priority Data

Oct. 3, 2003    (JP) ................................ 2003-346053

(51) Int. Cl.
*H01L 51/50* (2006.01)
*H01L 27/32* (2006.01)
*H01L 51/52* (2006.01)

(52) U.S. Cl.
CPC ........ *H01L 51/5088* (2013.01); *H01L 27/3211* (2013.01); *H01L 27/322* (2013.01);
(Continued)

(58) Field of Classification Search
CPC ........ H01L 51/5281–51/5284; H01L 27/3211; H01L 27/3218; H01L 27/3216; H01L 27/322; H01L 27/326; H01L 27/3295; H01L 27/3244–27/3279; H01L 2251/30–2251/558
USPC ................................. 313/498–512
See application file for complete search history.

(56) References Cited

U.S. PATENT DOCUMENTS 5,853,905 A   12/1998   So et al.
5,922,481 A   7/1999    Etzbach et al.
(Continued)

FOREIGN PATENT DOCUMENTS

CN   1168217    12/1997
CN   1275305    11/2000
(Continued)

OTHER PUBLICATIONS

Chinese Office Action (Application No. 201110050775.6) Dated Feb. 1, 2013.
(Continued)

*Primary Examiner* — Mariceli Santiago
(74) *Attorney, Agent, or Firm* — Eric J. Robinson; Robinson Intellectual Property Law Office, P.C.

(57) ABSTRACT

The present invention provides a light-emitting device comprising a first light-emitting element that emits red light, a second light-emitting element that emits green light, a third light-emitting element that emits blue light, and a color filter, where the color filter comprises a first coloring layer that selectively transmits red light, a second coloring layer that selectively transmits green light, and a third coloring layer that selectively transmits blue light, the first to third light-emitting elements respectively correspond to the first to third coloring layers, wherein each of the first to third light-emitting elements has a first electrode, an electroluminescent layer on the first electrode, and a second electrode on the electroluminescent layer, and wherein the electroluminescent layer includes a layer in contact with the second electrode, and a metal oxide or a benzoxazole derivative is included in the layer in contact with the second electrode.

40 Claims, 14 Drawing Sheets

(52) U.S. Cl.
CPC ......... *H01L27/3244* (2013.01); *H01L 27/3248* (2013.01); *H01L 51/5052* (2013.01); H01L 51/5092 (2013.01); *H01L 51/5212* (2013.01); *H01L 51/5228* (2013.01); *H01L 51/5237* (2013.01); *H01L 51/5284* (2013.01); *H01L 2251/5315* (2013.01)

(56) References Cited

U.S. PATENT DOCUMENTS

| | | | |
|---|---|---|---|
| 5,925,980 | A | 7/1999 | So et al. |
| 6,130,001 | A | 10/2000 | Shi et al. |
| 6,255,774 | B1 | 7/2001 | Pichler |
| 6,339,288 | B1 | 1/2002 | Qian et al. |
| 6,402,579 | B1 | 6/2002 | Pichler et al. |
| 6,445,005 | B1 | 9/2002 | Yamazaki et al. |
| 6,447,934 | B1 | 9/2002 | Suzuki et al. |
| 6,486,601 | B1 | 11/2002 | Sakai et al. |
| 6,488,555 | B2 | 12/2002 | Pichler et al. |
| 6,579,629 | B1 | 6/2003 | Raychaudhuri et al. |
| 6,815,723 | B2 | 11/2004 | Yamazaki et al. |
| 6,831,408 | B2 | 12/2004 | Hirano et al. |
| 6,869,635 | B2 | 3/2005 | Kobayashi |
| 6,894,312 | B2 | 5/2005 | Yamazaki et al. |
| 6,908,695 | B2 | 6/2005 | Seo et al. |
| 6,942,534 | B2 | 9/2005 | Shibasaki et al. |
| 6,956,240 | B2 | 10/2005 | Yamazaki et al. |
| 7,057,209 | B2 | 6/2006 | Yamazaki et al. |
| 7,129,965 | B2 | 10/2006 | Iwamatsu et al. |
| 7,291,973 | B2 | 11/2007 | Ishihara et al. |
| 7,420,210 | B2 | 9/2008 | Yamazaki et al. |
| 7,462,372 | B2 | 12/2008 | Konuma et al. |
| 7,488,986 | B2 | 2/2009 | Yamazaki et al. |
| 7,518,146 | B2 | 4/2009 | Yamazaki et al. |
| 7,719,014 | B2 | 5/2010 | Yamazaki et al. |
| 7,936,065 | B2 | 5/2011 | Mizuno et al. |
| 7,952,103 | B2 | 5/2011 | Yamazaki et al. |
| 7,994,496 | B2 | 8/2011 | Saito et al. |
| 2001/0049030 | A1 | 12/2001 | Okada et al. |
| 2002/0093284 | A1 | 7/2002 | Adachi et al. |
| 2003/0042849 | A1* | 3/2003 | Ogino .................... 313/504 |
| 2003/0122140 | A1* | 7/2003 | Yamazaki et al. ............ 257/88 |
| 2003/0151056 | A1* | 8/2003 | Yamazaki ................ 257/98 |
| 2003/0151259 | A1 | 8/2003 | Feddersen et al. |
| 2003/0219530 | A1* | 11/2003 | Yamazaki et al. ............. 427/66 |
| 2004/0027055 | A1* | 2/2004 | Yamazaki et al. ............ 313/498 |
| 2004/0263506 | A1* | 12/2004 | Koyama et al. ............... 345/204 |
| 2005/0040390 | A1 | 2/2005 | Pfeiffer et al. |
| 2006/0170339 | A1* | 8/2006 | Kanno et al. .................. 313/506 |
| 2011/0227088 | A1 | 9/2011 | Yamazaki et al. |

FOREIGN PATENT DOCUMENTS

| | | |
|---|---|---|
| CN | 1428869 | 7/2003 |
| EP | 1 009 198 | 6/2000 |
| EP | 1 179 862 | 2/2002 |
| EP | 1 468 832 A | 10/2004 |
| JP | 09-063771 A | 3/1997 |
| JP | 10-308284 | 11/1998 |
| JP | 11-307259 | 11/1999 |
| JP | 2000-182768 | 6/2000 |
| JP | 2000-268959 | 9/2000 |
| JP | 2000-517469 | 12/2000 |
| JP | 2001-043980 | 2/2001 |
| JP | 2001-176673 | 6/2001 |
| JP | 2002-056985 | 2/2002 |
| JP | 2002-075658 | 3/2002 |
| JP | 2002-299044 | 10/2002 |
| JP | 2002-359086 | 12/2002 |
| JP | 2003-007474 | 1/2003 |
| JP | 2003-068472 | 3/2003 |
| JP | 2003-205646 A | 7/2003 |
| JP | 3451680 | 7/2003 |
| JP | 2003-249357 | 9/2003 |
| JP | 2003-257657 | 9/2003 |
| JP | 2005-525696 | 8/2005 |
| WO | WO 98/10473 | 3/1998 |
| WO | WO 98/10621 | 3/1998 |
| WO | WO 00/01203 | 1/2000 |
| WO | WO 01/15244 | 3/2001 |
| WO | WO 03/070822 | 8/2003 |

OTHER PUBLICATIONS

Office Action (Chinese Application No. 200410083573.1) dated Apr. 18, 2008.

* cited by examiner 401  402  403
     404

406  407  408
     405

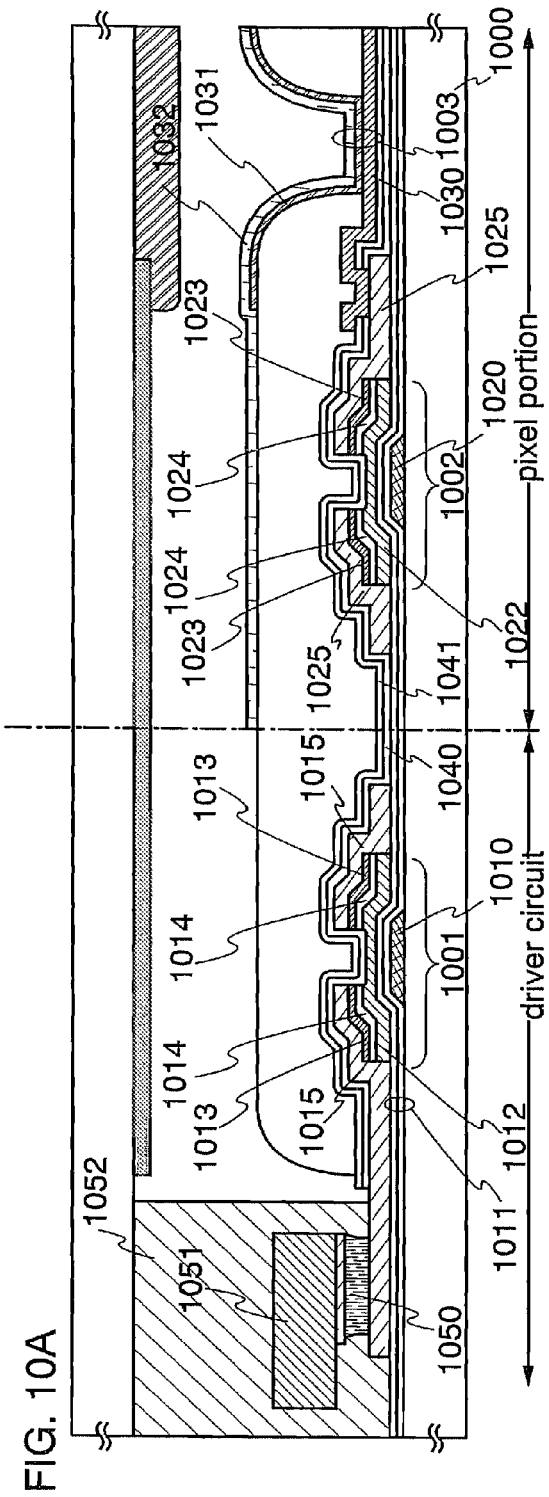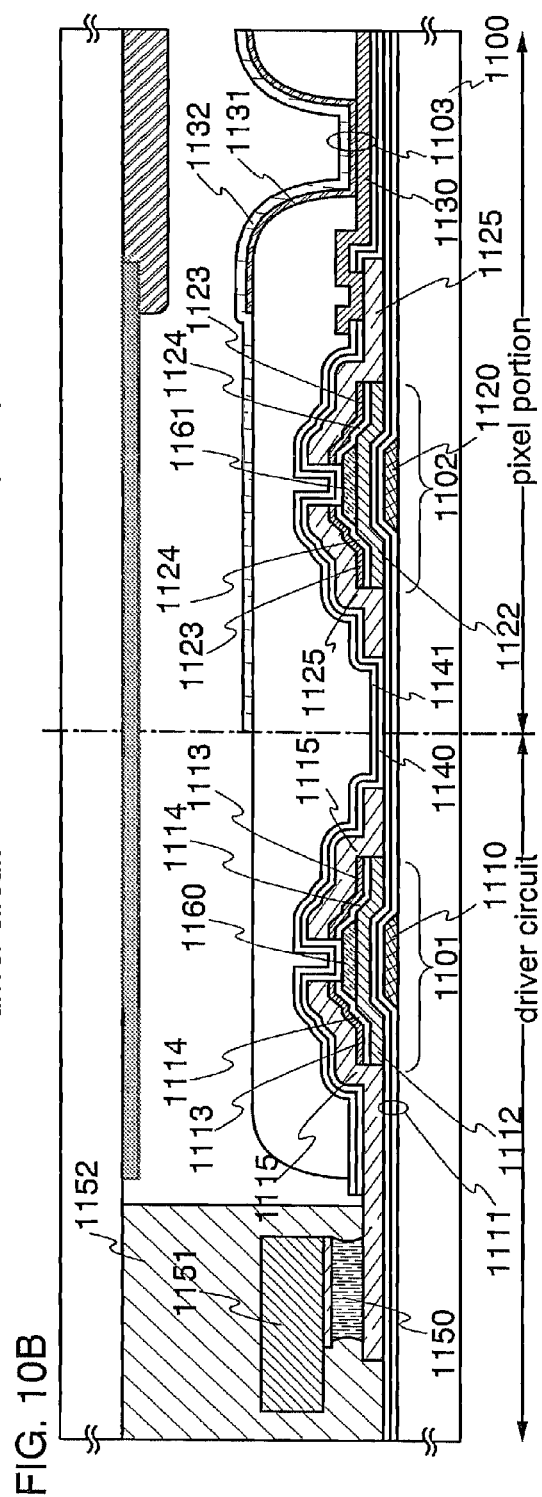

LIGHT EMITTING DEVICE

BACKGROUND OF THE INVENTION

1. Field of the Invention

The present invention relates to a light-emitting device that has a light-emitting element in each pixel.

2. Description of the Related Art

A light-emitting element itself emits light with high visibility, needs no backlight that is required for a liquid crystal display device (LCD) to be suitable for reduction in thickness, and has no limit of viewing angle. Therefore, a light-emitting device using a light-emitting element has been attracting attention as an alternative display device to a CRT or an LCD, and has been putting into practical use. An OLED (Organic Light Emitting Diode) that is one of light-emitting elements has a layer including an electroluminescent material from which luminescence (electroluminescence) can be obtained by applying an electric field (hereinafter, referred to as an electroluminescent layer), an anode, and a cathode. By combining a hole injected from the anode and an electron injected from the cathode in the electroluminescent layer, luminescence can be obtained. The luminescence that can be obtained from the electroluminescent layer includes luminescence (fluorescence) on returning to the ground state from a singlet excited state and luminescence (phosphorescence) on returning to the ground state from a triplet excited state.

The obtained light can be extracted from any of the anode side and the cathode side in principle. In the case of an active matrix light-emitting device, it is preferable that the light is extracted from the electrode, the anode or the cathode on the side that is farther away from a substrate over which a wiring or a gate electrode of a transistor is formed since a high extraction efficiency can be kept independently of a decrease in aperture ratio with high resolution. The light can be extracted from the electrode by using either method of forming the electrode thinly enough to transmit light or forming the electrode with the use of a transparent conductive film. However, in the former method of the above-mentioned two methods, it is difficult to enhance a light extraction efficiency sufficiently since transmissivity has a limit.

On the other hand, in the case of using the latter method, it is relatively easy to enhance a light extraction efficiency as compared the former.

However, when sputtering is used to form a transparent conductive film typified by ITO (Indium Tin Oxide) on an electroluminescent layer, there is a problem that a layer including an organic material is subjected to damage (sputter damage) in the electroluminescent layer. In the case of using evaporation to form a transparent conductive film, damage to the layer including the organic material can be suppressed. However, in this case, an electrode to be formed is reduced in transmissivity and is increased in resistivity, which is undesirable. Now therefore, it is desired to propose a light-emitting device, where sputtering is used to form an electrode on an electroluminescent layer without damage to a layer including an organic material.

In order to perform displaying in full color with a light-emitting device, a method of using three kinds of light-emitting elements corresponding to R (red), G (green), and B (blue) or a method of combining a light-emitting element that emits white light and a color filter is generally used. However, in the case of the former method, it is necessary to enhance the color purity of luminescence corresponding to each of R (red), G (green), and B (blue), and then spend a lot of cost and time to optimize an electroluminescent material and a device structure. In the case of the latter method, light shielded by the color filter is wasted, and then, there is a problem that no high luminance can be obtained for the power consumption.

SUMMARY OF THE INVENTION

In view of the above-mentioned problems, it is an object of the present invention to provide a light-emitting device that is high in color purity of light and is high in light extraction efficiency, where sputtering is used to form an electrode on an electroluminescent layer without damage to a layer including an organic material.

In the present invention, a material that is resistant to etching is used for a layer of an electroluminescent layer, which is closest to an electrode that is formed by sputtering on the electroluminescent layer. Specifically, using at least one of a metal oxide and a benzoxazole derivative is advised.

Specific examples of the metal oxide include molybdenum oxide (MoOx), vanadium oxide (VOx), ruthenium oxide (RuOx), and tungsten oxide (WOx), and it is preferred that these are formed by evaporation. In addition, the structure of the benzoxazole derivative is represented by Chemical Formula 1.

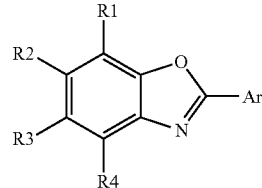

(Formula 1)

(where Ar is an aryl group, and R1 to R4 are individually hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.)

A light-emitting element according to the present invention has a first electrode, an electroluminescent layer formed on the first electrode, a second electrode formed on the electroluminescent layer, where the electroluminescent layer may be a single layer or a multilayer, and has a layer from which luminescence can be actually obtained (a light-emitting layer) appropriately in combination with a layer such as a layer including a highly carrier (electron/hole) transporting material or a layer including a highly carrier injecting material.

For example, in the case where the first electrode serves as a cathode and the second electrode serves as an anode, the above-mentioned material that is resistant to etching is used for a hole injecting or hole transporting layer of the electroluminescent layer, which is closest to the anode. Specifically, in the case of using a benzoxazole derivative, a layer including the benzoxazole derivative and one or more materials of tetracyanoquinodimethane (TCNQ), $FeCl_3$, $C_{60}$, and 2,3,5,6-tetrafluoro-7,7,8,8-tetracyanoquinodimethane ($F_4$-TCNQ) is formed to be closest to the anode.

Alternatively, in the case where the first electrode serves as an anode and the second electrode serves as a cathode, for example, the above-mentioned material that is resistant to etching is used for an electron injecting or electron transporting layer of the electroluminescent layer, which is closest to the cathode. Specifically, in the case of using molybdenum oxide, a layer including the molybdenum oxide and one or more materials of an alkali metal, an alkali earth metal, and a transition metal is formed to be closest to the cathode. In the case of using a benzoxazole derivative, a layer including the benzoxazole derivative and one or more materials of an alkali metal, an alkali earth metal, and a transition metal is formed to be closest to the cathode. Both the metal oxide and the benzoxazole derivative may be used.

According to the above-mentioned aspect of the present invention, even when a transparent conductive film formed by sputtering, for example, indium tin oxide (ITO), Indium Tin Oxide containing silicon (ITSO), or IZO (Indium Zinc Oxide) of indium oxide mixed with zinc oxide (ZnO) at 2 to 20% is used as the second electrode, sputter damage to a layer including an organic material of the electroluminescent layer can be suppressed, and then, the material for forming the second electrode has a wide range of choice. Further, in the present invention, the light extraction efficiency can be enhanced by extracting light from the second electrode side as compared with a case of extracting light from the first electrode side.

It is often the case that a spectrum of light obtained from a light-emitting element has a peak in a relatively wide wavelength range. Therefore, there is a problem that the color purity is inferior. Further, not only color purity but also reliability is required to be high as for characteristics of a light-emitting element. However, the present situation is spending a lot of time and cost to develop and obtain a light-emitting element that meets the both characteristics sufficiently. Consequently, in a light-emitting device according to the present invention, a plurality of light-emitting elements that have different wavelength ranges in emitting light and a color filter are used to extract only light in a specific wavelength range of light emitted from each of the light-emitting elements. According to the above-mentioned aspect of the present invention, even when a light-emitting element that has a relatively wide wavelength range is used, an unnecessary wavelength of light obtained from the light-emitting element is shielded by a color filter to enable extracting only a necessary wavelength range, hence it is easy to obtain a high color purity. Therefore, the electroluminescent material that is used for the light-emitting element is allowed to have a wide range of choice. In addition, the amount of light to be shielded by a color filter can be suppressed by selecting an electroluminescent material in accordance with a wavelength of light to be extracted as compared with a case of combining a light-emitting element that emits white light and a color filter, and the extraction efficiency can be enhanced.

The light-emitting device according to the present invention is not limited to an active matrix light-emitting device, and may be a passive matrix light-emitting device.

As described above, according to the present invention, sputtering can be used to form an electrode on an electroluminescent layer without damaging a layer including an organic material, hence it is possible to provide a light-emitting device where a defect due to sputter damage is suppressed. Therefore, the material of the electrode to be formed on the electroluminescent layer is allowed to have a wide range of choice. In addition, a color purity of light can be easily enhanced by using a color filter, and a light extraction efficiency can be enhanced as compared to a case of combining a white light-emitting element and a color filter. Further, since it becomes possible to give priority to characteristics other than color purity, such as reliability, to some extent, the electroluminescent material is allowed to have a wide range of choice.

BRIEF DESCRIPTION OF THE DRAWINGS

In the accompanying drawings:

FIGS. 10 A and 10 B are cross-sectional views of light-emitting devices according to the present invention;

DETAILED DESCRIPTION OF THE INVENTION

A structure of a light-emitting device according to the present invention will be described. The light-emitting device according to the present invention has a plurality of pixels corresponding to three primary colors, for example, red (R), green (G), blue (B), and a color filter. Each of the pixels has a light-emitting element, and light emitted from the light-emitting element includes at least a wavelength of a color corresponding to the pixel. However, light emitted from the light-emitting element does not always have the same spectrum as the others.

In the present invention, a layer that has a particularly high transmissivity to light in a specific wavelength range as compared to the other range (a coloring layer), which is included in the color filter, is used to shield light in a specific wavelength range of light emitted from each light-emitting element. In the case of light emitted from the light-emitting element of the pixel corresponding to a red, for example, light in the wavelength range corresponding to the red is controlled to be selectively transmitted by the coloring layer. Also in the pixel corresponding to the other color, light in the wavelength range corresponding to the corresponding color is transmitted selectively in the same way.

Figure 1A:
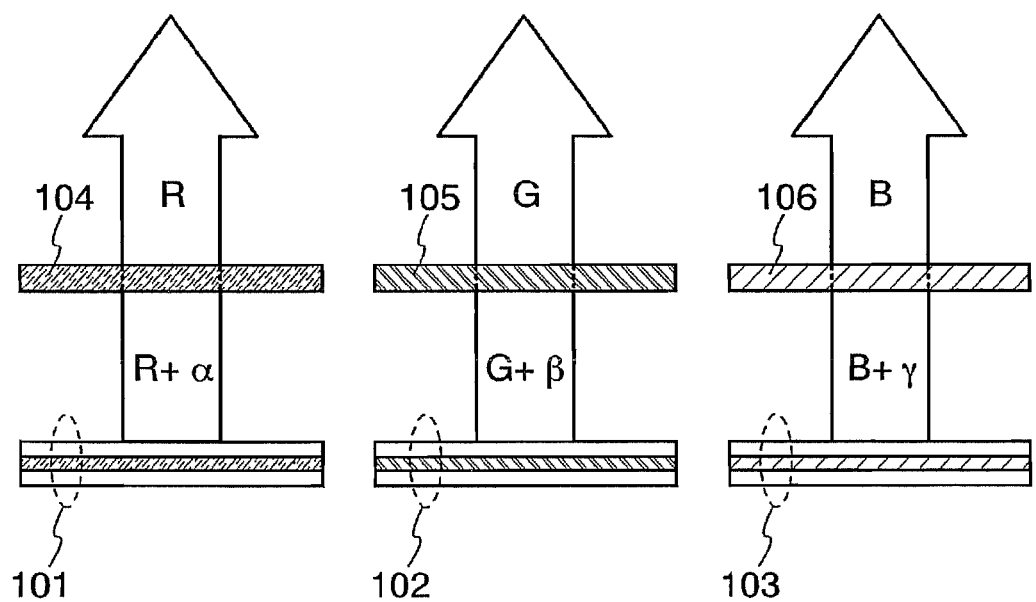
FIGS. 1A and 1B are diagrams showing schematically a relationship between a color of light emitted from a light-emitting element and a color of light transmitted through a coloring layer.

FIG. 1A schematically shows a relationship between a color of light emitted from a light-emitting element and a color of light transmitted through a coloring layer. In FIG. 1A, reference numeral 101 denotes a light-emitting element of a pixel corresponding to a red, and light emitted from the light-emitting element 101 is presumed to include light of a color (α) other than the red (R) in addition to light of the red. Similarly, reference numeral 102 denotes a light-emitting element of a pixel corresponding to a green, and light emitted from the light-emitting element 102 is presumed to include light of a color (β) other than the green (G) in addition to light of the green. Reference numeral 103 denotes a light-emitting element of a pixel corresponding to a blue, and light emitted from the light-emitting element 103 is presumed to include light of a color (γ) other than the blue (B) in addition to light of the blue.

Further, a coloring layer corresponding to each pixel is shown in FIG. 1A. Specifically, a coloring layer 104 corresponding to the light-emitting element 101, a coloring layer 105 corresponding to the light-emitting element 102, and a coloring layer 106 corresponding to the light-emitting element 103 are shown in the figure.

The coloring layer 104 is able to transmit light in the wavelength range corresponding to the red selectively. In other words, since the light of the color (α) other than the red, of the light emitted from the light-emitting element 101, is shielded, only the light of the red can be selectively extracted. Similarly, the coloring layer 105 is able to transmit light in the wavelength range corresponding to the green selectively. In other words, since the light of the color (β) other than the green, of the light emitted from the light-emitting element 102, is shielded, only the light of the green can be selectively extracted. In addition, the coloring layer 106 is able to transmit light in the wavelength range corresponding to the blue selectively. In other words, since the light of the color (γ) other than the blue, of the light emitted from the light-emitting element 103, is shielded, only the light of the blue can be selectively extracted.

Accordingly, the color purity of light extracted from the pixel can be enhanced with the above-mentioned structure, even when the color purity of light emitted from each of the light-emitting elements 101 to 103 is inferior in some degree. As for the light-emitting element of the pixel corresponding to each color, it is preferable that the spectrum of light emitted from the light-emitting element has a peak with relatively high intensity in the wavelength range corresponding to the color as compared with the other wavelength range. For example, in the case of the pixel corresponding to the red, it is preferable that the spectrum of light emitted from the light-emitting element is controlled to have a peak with relatively high intensity in the wavelength range corresponding to the red. With the above-mentioned structure, the amount of light to be shielded can be suppressed with respect to the pixel corresponding to each color, and light can be efficiently extracted as compared with a case of using a light-emitting element that emits white light.

FIG. 1A shows an example where light obtained from a light-emitting element has a different spectrum depending on a pixel corresponding to each color. However, the present invention is not limited to this structure. For example, among pixels corresponding to three colors respectively, the pixels corresponding to the two colors may have light-emitting elements from which the same spectrum of light can be obtained respectively.

Figure 1B:
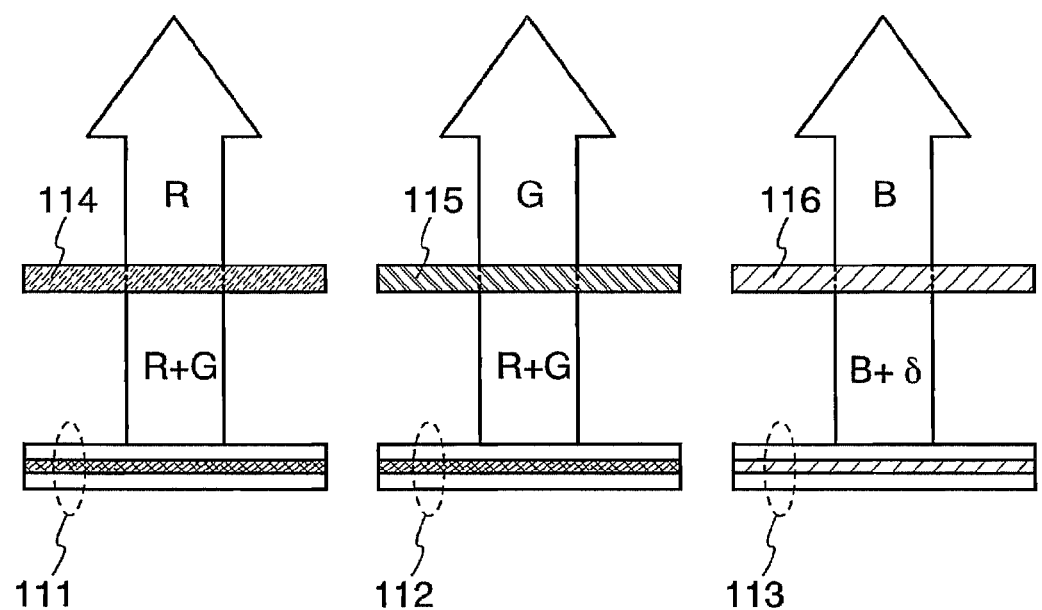

With reference to FIG. 1B, a structure according to the present invention will be described, where a light-emitting element of a pixel corresponding to a red and a light-emitting element of a pixel corresponding to a green have the same spectrum of light. In FIG. 1B, reference numeral 111 denotes a light-emitting element of a pixel corresponding to a red and reference numeral 112 denotes a light-emitting element of a pixel corresponding to a green, light emitted from each of the light-emitting elements 111 and 112 is presumed to include light of the red (R) and light of the green (G). In addition, reference numeral 113 denotes a light-emitting element of a pixel corresponding to a blue, and light emitted from the light-emitting element 113 is presumed to include light of a color (δ) other than the blue (B) in addition to light of the blue.

Further, a coloring layer corresponding to each pixel is shown in FIG. 1B. Specifically, a coloring layer 114 corresponding to the light-emitting element 111, a coloring layer 115 corresponding to the light-emitting element 112, and a coloring layer 116 corresponding to the light-emitting element 113 are shown in the figure.

The coloring layer 114 is able to transmit light in the wavelength range corresponding to the red selectively. Therefore, since the light of the green (G), of the light emitted from the light-emitting element 111, is shielded, only the light of the red (R) can be selectively extracted. Similarly, the coloring layer 115 is able to transmit light in the wavelength range corresponding to the green selectively. In other words, since the light of the red (R), of the light emitted from the light-emitting element 112, is shielded, only the light of the green (G) can be selectively extracted. In addition, the coloring layer 116 is able to transmit light in the wavelength range corresponding to the blue selectively. In other words, since the light of the color (δ) other than the blue, of the light emitted from the light-emitting element 113, is shielded, only the light of the blue can be selectively extracted.

As described above, an electroluminescent material is allowed to have a substantially wide range of choice in the present invention.

Figure 2:
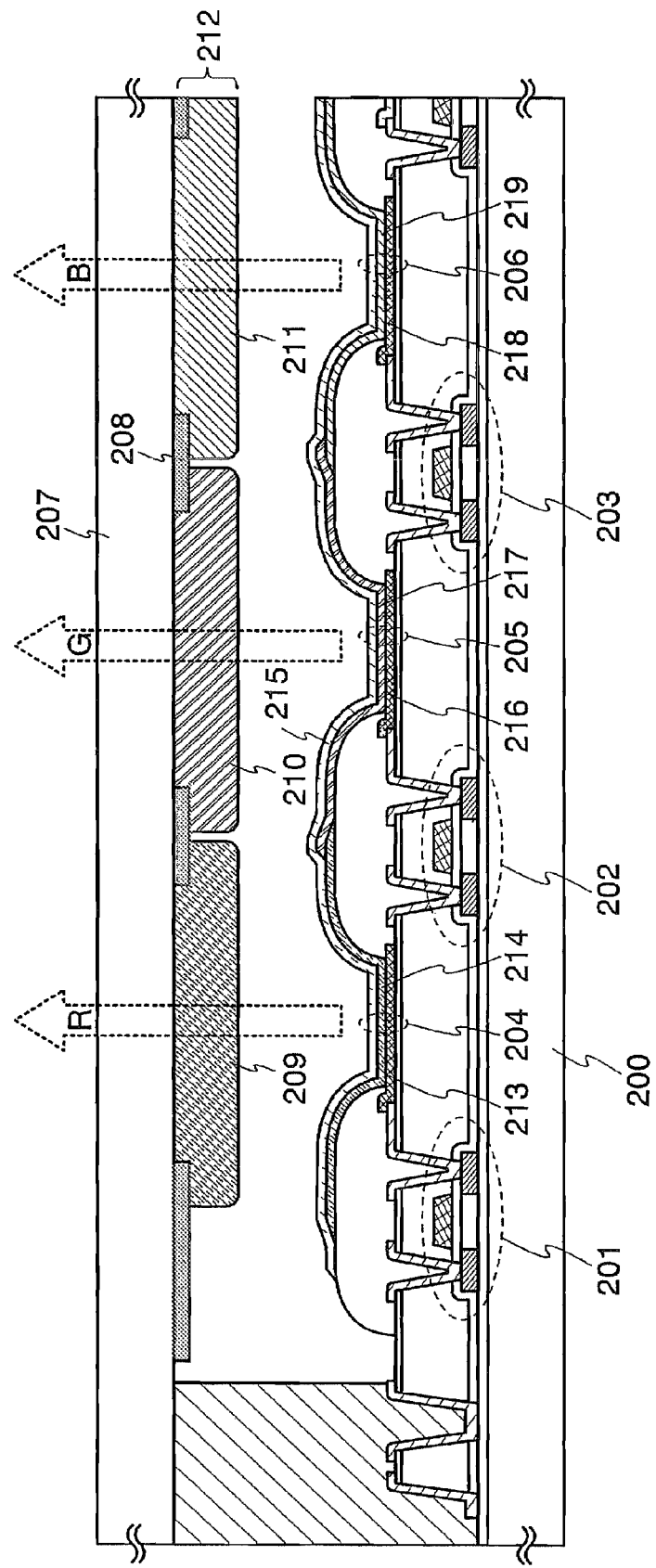
FIG. 2 is a cross-sectional view of a light-emitting device according to the present invention.

Next, a more specific structure of a light-emitting device according to the present invention will be described with reference to FIG. 2. FIG. 2 shows a form of a cross-sectional view of a pixel in a light-emitting device according to the present invention. In FIG. 2, TFTs 201 to 203 and light-emitting elements 204 to 206 are formed over a substrate 200. The TFT 201 and the light-emitting element 204 are provided in a pixel corresponding a red (R), and the current supply to the light-emitting element 204 is controlled by the TFT 201. The TFT 202 and the light-emitting element 205 are provided in a pixel corresponding a green (G), and the current supply to the light-emitting element 205 is controlled by the TFT 202. The TFT 203 and the light-emitting element 206 are provided in a pixel corresponding a blue (B), and the current supply to the light-emitting element 206 is controlled by the TFT 203.

Further, reference numeral 207 denotes a covering material for sealing of the light-emitting elements 204 to 206, which has a light-transmitting property. Adjacent to the covering material 207, a color filter 212 that has a shielding film 208 for shielding visible light and coloring layers 209 to 211 corresponding the pixels corresponding the respective colors is formed. In the case of FIG. 2, light in the wavelength range corresponding to the red, of light emitted from the light-emitting element 204, is selectively transmitted through the coloring layer 209, light in the wavelength range corresponding to the green, of light emitted from the light-emitting element 205, is selectively transmitted through the coloring layer 210, and light in the wavelength range corresponding to the blue, of light emitted from the light-emitting element 206, is selectively transmitted through the coloring layer 211.

The shielding film 208 is arranged to overlap a portion between the light-emitting elements, such as a portion between the light-emitting elements 204 and 205 and a portion between the light-emitting elements 205 and 206, and is able to prevent light from the light-emitting element from being transmitted through the coloring layer corresponding to the adjacent pixel.

For the coloring layer, a material that is generally used can be used. For example, a pigment is dispersed in a light-transmitting organic material such as a resin to form the coloring layer. In addition, a material that is generally used can be used for the shielding film. A metal typified by Cr may be used to form the shielding film, or a black pigment is dispersed in a light-transmitting organic material such as a resin to form the shielding film. Further, inkjet may be used to form the coloring layer adjacent to the covering layer.

The light-emitting element 204 has a first electrode 213 electrically connected to the TFT 201, an electroluminescent layer 214 formed on the first electrode 213, and a second electrode 215 formed on the electroluminescent layer 214, and a portion where the first electrode 213, the electroluminescent layer 214, and the second electrode 215 are overlapped with each other corresponds to the light-emitting element 204.

The light-emitting element 205 has a first electrode 216 electrically connected to the TFT 202, an electroluminescent layer 217 formed on the first electrode 216, and the second electrode 215 formed on the electroluminescent layer 217, and a portion where the first electrode 216, the electroluminescent layer 217, and the second electrode 215 are overlapped with each other corresponds to the light-emitting element 205.

The light-emitting element 206 has a first electrode 218 electrically connected to the TFT 203, an electroluminescent layer 219 formed on the first electrode 218, and the second electrode 215 formed on the electroluminescent layer 219, and a portion where the first electrode 218, the electroluminescent layer 219, and the second electrode 215 are overlapped with each other corresponds to the light-emitting element 206.

In FIG. 2, the electroluminescent layer 214, 217, or 219 that has a different electroluminescent material included or a different element structure is used depending on the pixel corresponding to each color. However, the present invention is not always limited to this structure. In at least pixels corresponding to two colors respectively, electroluminescent layers that have different electroluminescent materials included or different element structures from each other are used respectively.

In the present invention, a transparent conductive film such as ITO, ITSO, or IZO, mentioned above, is used for the second electrode 215 formed on the electroluminescent layers 214, 217, and 219, which is formed by sputtering. In each of the electroluminescent layers 214, 217, and 219, the top layer in contact with the second electrode 215 includes at least one of a metal oxide and a benzoxazole derivative.

Figure 3:
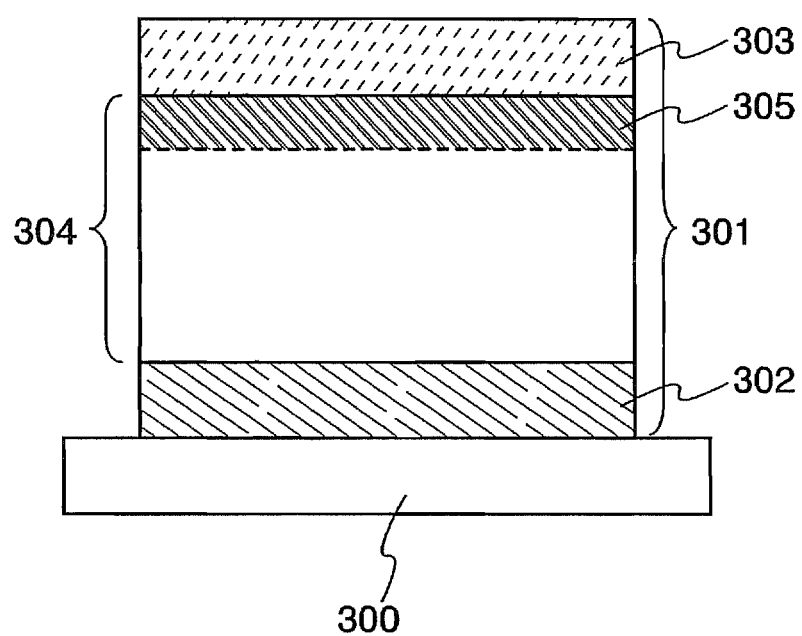
FIG. 3 is a diagram showing a structure of a light-emitting element in a light-emitting device according to the present invention.

Next, a structure of a light-emitting element according to the present invention will be described with reference to FIG. 3. FIG. 3 schematically shows a structure of a light-emitting element according to the present invention. A light-emitting element 301 according to the present invention has a first electrode 302 formed over a substrate 300, a second electrode 303, and an electroluminescent layer 304 provided between the first electrode 302 and the second electrode 303. In practice, components such as various layers or a semiconductor element are provided between the substrate 300 and the light-emitting element 301.

One of the first electrode 302 and the second electrode 303 corresponds to an anode, and the other corresponds to a cathode. In FIG. 3, the first electrode 302 serves as a cathode, and the second electrode 303 serves as an anode. Further, in the present invention, a material that is resistant to etching by sputtering, such as a metal oxide or a benzoxazole derivative, is included in a layer 305 of the electroluminescent layer 304, which is closest to the second electrode 303 formed on the electroluminescent layer 304. Specifically, FIG. 3 shows an example where the second electrode 303 serves as an anode. Therefore, in order to give a hole injecting property to the layer 305 that is closest to the second electrode 303, in the case of using a benzoxazole derivative, the benzoxazole derivative and one or more materials of TCNQ, $FeCl_3$, $C_{60}$, and $F_4$-TCNQ are included in the layer 305.

As the metal oxide, molybdenum oxide (MoOx), vanadium oxide (VOx), ruthenium oxide (RuOx), and tungsten oxide (WOx), for example, can be used. By using the metal oxide or the benzoxazole derivative in this way, sputter damage to a layer including an organic material, of the electroluminescent layer 304, can be suppressed when the second electrode 303 is formed by sputtering. Both in the case of including the metal oxide and in the case of including the benzoxazole derivative, the layer 305 that is closest to the second electrode 303 can be formed by using evaporation. In addition, an effect of suppressing damage due to sputtering can be enhanced by controlling the film thickness of the layer 305 to be 10 nm or more.

Contrary, in the case where the first electrode 302 serves as an anode and the second electrode 303 serves as a cathode, in order to give an electron injecting property to the layer 305 that is closest to the second electrode 303, the layer 305 include one or more materials of an alkali metal, an alkali earth metal, and a transition metal in the case of using any of a metal oxide and a benzoxazole derivative.

In the light-emitting device according to the present invention, the shielding film of the color filter is able to prevent the first electrode from reflecting outside light to reflect an object into the pixel portion like a mirror surface. Therefore, it is not necessary to use a polarizing plate that has a significantly low transmissivity as compared with the color filter, and a light extraction efficiency can be enhanced spectacularly. In addition, a decrease in extraction efficiency due to attenuation of light is not caused by using a structure such as a micro cavity in order to enhance a color purity.

Embodiment 1

In the present embodiment, a form of how to lay out a light-emitting element and a coloring layer and shielding film of a color filter will be described.

Figure 4A:
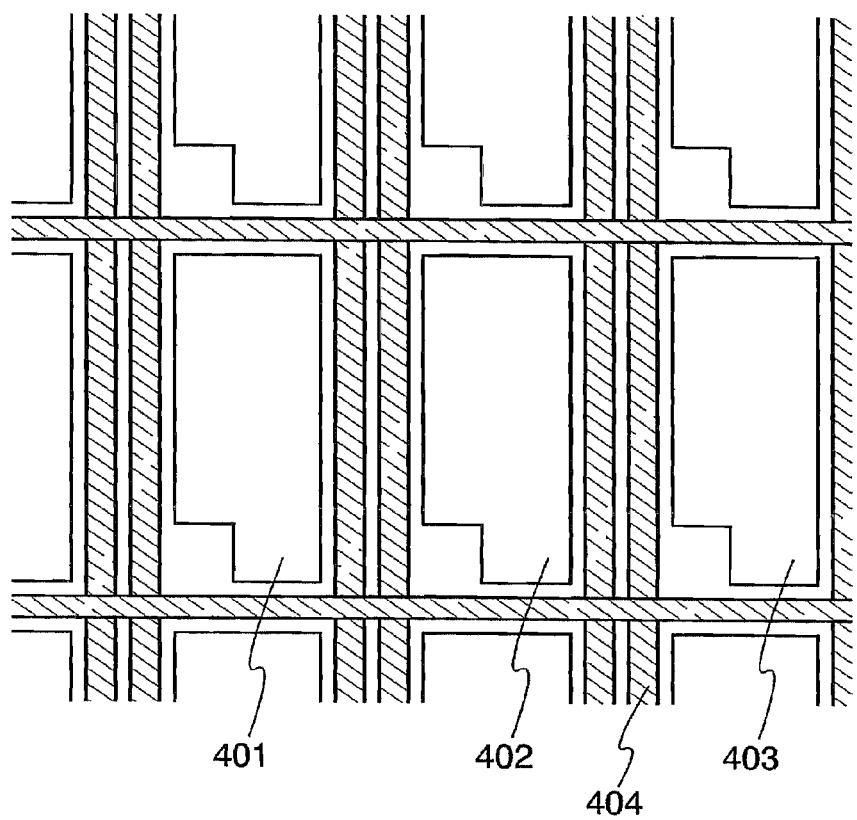
FIGS. 4A and 4B are top views of a pixel of a light-emitting device according to the present invention.

FIG. 4A shows a top view of a pixel of a light-emitting device according to the present invention. However, FIG. 4A shows a state before sealing with a covering material, where reference numerals 401 to 403 denote light-emitting elements and reference numeral 404 denotes a wiring for controlling a supply of a signal or a power supply voltage to a pixel. Further, various interlayer films and a partition are omitted in the figure. In the present embodiment, the light-emitting element 401 is presumed to be formed in a pixel corresponding a red (R), the light-emitting element 402 is presumed to be formed in a pixel corresponding a green (G), and the light-emitting element 403 is presumed to be formed in a pixel corresponding a blue (B).

Figure 4B:
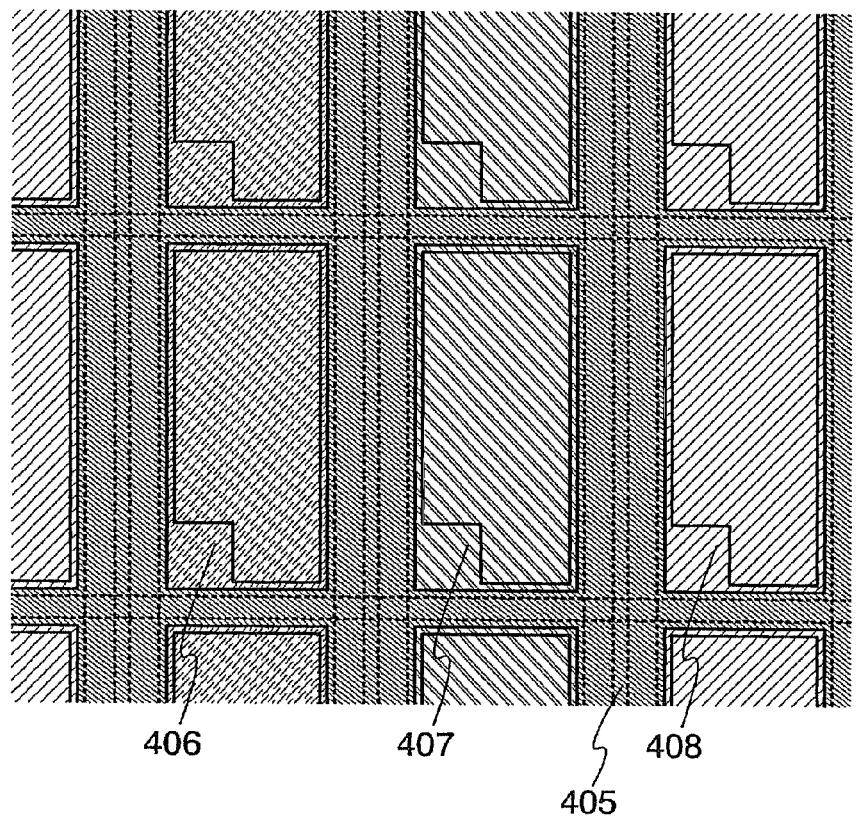

FIG. 4B then shows a state where the pixels shown in FIG. 4A are encapsulated with a cover material. Reference numeral 405 denotes a shielding film, which is arranged to fill a portion between the light-emitting elements, such as a portion between the light-emitting elements 401 and 402 and a portion and between the light-emitting elements 402 and 403. In addition, reference numerals 406 to 408 denote coloring layers, which are formed respectively in opening portions of the shielding film 405. Of light emitted from the light-emitting element 401, light in the wavelength range corresponding to the red can be extracted selectively by the coloring layer 406. Of light emitted from the light-emitting element 402, light in the wavelength range corresponding to the green can be extracted selectively by the coloring layer 407. Of light emitted from the light-emitting element 403, light in the wavelength range corresponding to the blue can be extracted selectively by the coloring layer 408.

Embodiment 2

In the present embodiment, the mechanism of an improvement in color purity by a color filter will be described.

Figure 5A:
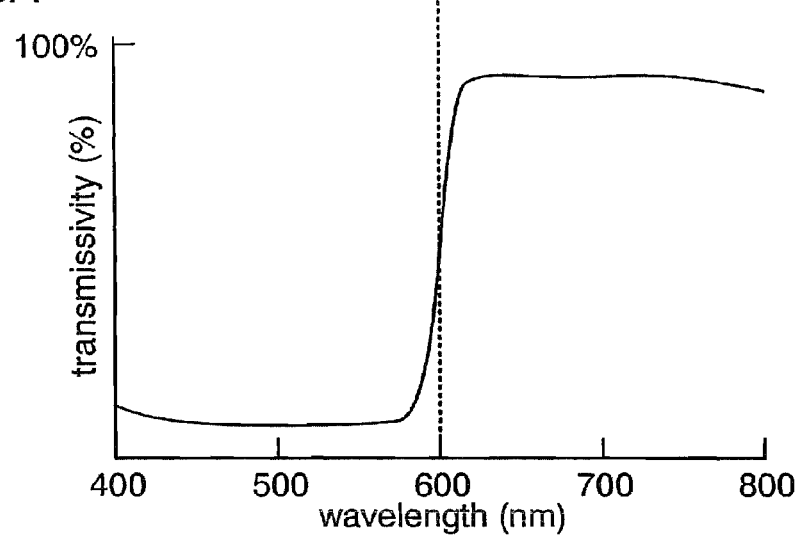
FIGS. 5A to 5C are diagrams showing a relationship between a wavelength of light and a transmissivity with respect to a coloring layer.

FIG. 5A shows a relationship between a wavelength of light and a transmissivity with respect to a coloring layer as an example. In FIG. 5A, the wavelength range that has shorter wavelengths than 600 nm is much lower in transmissivity than the wavelength range that has longer wavelengths than 600 nm.

Figure 5B:
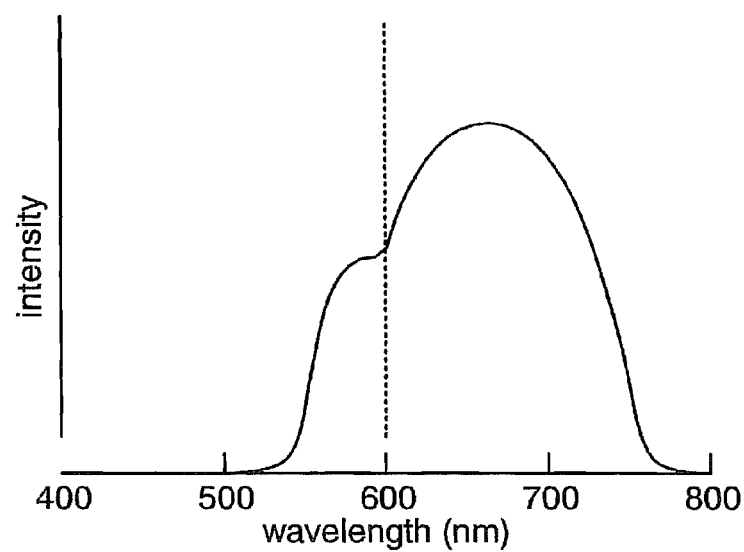

Further, FIG. 5B shows a spectrum in the case of light in the wavelength range corresponding to a red, which is mixed with light in the wavelength range corresponding to a green. The spectrum shown in FIG. 5B has a small shoulder from 550 nm to 600 nm in addition to a peak in the wavelength range corresponding to the red including 700 nm. The light with this spectrum is low in purity of the red, and seems to be greenish red.

Figure 5C:
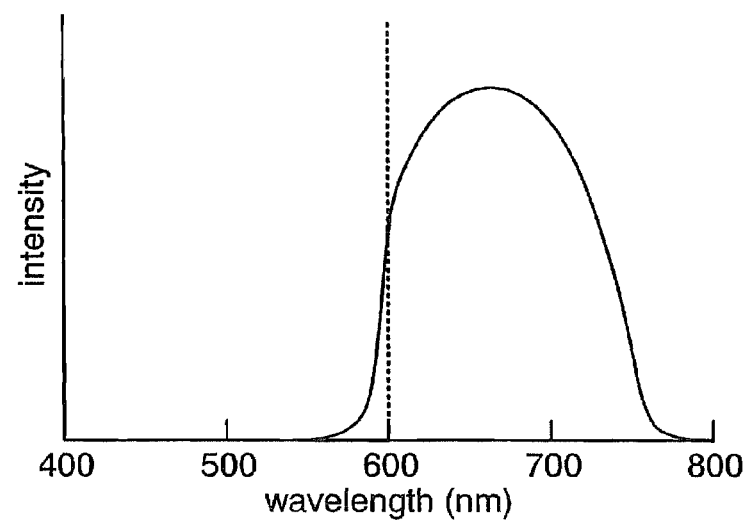

Then, by transmitting the light with the spectrum shown in FIG. 5B through the coloring layer that has the characteristics shown in FIG. 5A, light with a spectrum shown in FIG. 5C can be obtained. Specifically, the shoulder of the spectrum in FIG. 5B is almost entirely reduced since light including a wavelength of 600 nm or less, which is close to the wavelength region corresponding to the green including 546 nm, is shielded. Accordingly, the light extracted through the coloring layer is improved in color purity of the red.

The wavelength range corresponding to each of a red, a green, and a blue can be determined appropriately in accordance with a color purity desired by a designer. In the case of requiring a higher color purity, the width of the wavelength range corresponding the color may be narrowed.

Embodiment 3

In the present embodiment, a specific example of a light-emitting element of a light-emitting device according to the present invention will be described.

Figure 6A:
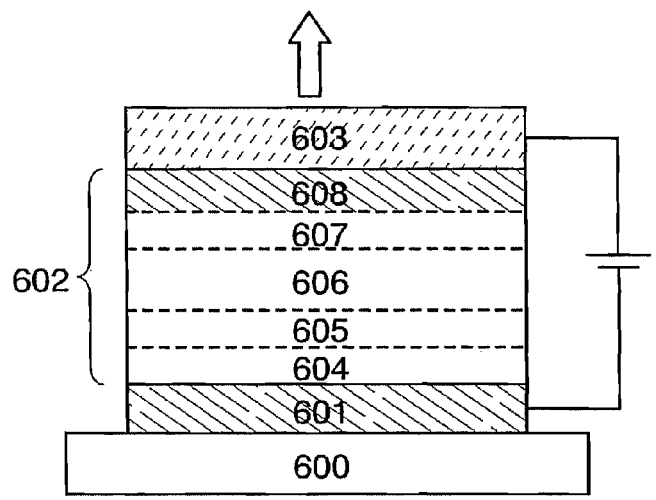
FIGS. 6A to 6C are diagrams showing structures of a light-emitting element in a light-emitting device according to the present invention.

With reference to FIG. 6A, a structure of a light-emitting element from which light in the wavelength range corresponding to a blue can be obtained will be described. The light-emitting element shown in FIG. 6A has, over a substrate 600, a first electrode 601, an electroluminescent layer 602 formed on the first electrode 601, and a second electrode 603 formed on the electroluminescent layer 602. In FIG. 6A, the first electrode 601 serves as a cathode and the second electrode 603 serves as an anode.

In the present invention, a metal, an alloy, an electrically conductive compound, and a mixture of these, which have a small work function and are generally used for a cathode of a light-emitting element, can be used to form the first electrode 601. Specifically, in addition to an alkali metal such as Li or Cs, an alkali earth metal such as Mg, Ca, or Sr, and an alloy including the metal (such as Mg:Ag or Al:Li), a rare-earth metal such as Yb or Er can also be used to form the first electrode 601. Further, a common conductive film such as aluminum can also be used since a layer including a highly electron injecting material is formed to come in contact with the first electrode 601.

It is preferable that a conductive material that has a large work function is used to form the second electrode 603. In the case of transmitting light through the second electrode 603, a highly light-transmitting material is used. In this case, a transparent conductive film such as indium-tin oxide (ITO), indium-zinc oxide (IZO), or indium-tin oxide including silicon oxide (ITSO) may be used.

Further, in FIG. 6A, the electroluminescent layer 602 has first to fifth layers 604 to 608. It is preferable that a highly electron injecting material is used for the first layer 604 formed to come in contact with the first electrode 601 that serves as a cathode. Specifically, an ultra thin film including an insulator such as an alkali metal halide such as LiF or CsF, an alkali earth halide such as $CaF_2$, or an alkali metal oxide such as $Li_2O$ is often used. In addition, alkali-metal complexes such as lithium acetyl acetonate (abbreviation: Li(acac)) and 8-quinolinolato-lithium (abbreviation: Liq) are also efficient. Further, the first layer 604 may include one of a metal oxide such as molybdenum oxide (MoOx), vanadium oxide (VOx), ruthenium oxide (RuOx), or tungsten oxide (WOx) and a benzoxazole derivative, and one or more materials of an alkali metal, an alkali earth metal, and a transition metal.

It is preferable that a highly electron transporting material is used for the second layer 605 formed on the first layer 604. Specifically, a metal complex that has a quinoline skeleton or a benzoquinoline skeleton, as typified by $Alq_3$, and a mixed ligand complex can be used. More specifically, the highly electron transporting material includes metal complexes such as $Alq_3$, $Almq_3$, $BeBq_2$, BAlq, $Zn(BOX)_2$, and $Zn(BTZ)_2$. Further, in addition to the metal complexes, oxadiazole derivatives such as 2-(4-biphenylyl)-5-(4-tert-butylphenyl)-1,3,4-oxadiazole (PBD) and 1,3-bis[5-(p-tert-butylphenyl)-1,3,4-oxadiazole-2-yl]benzene (OXD-7), triazole derivatives such as 3-(4-tert-butylphenyl)-4-phenyl-5-(4-biphenylyl)-1,2,4-triazole (TAZ) and 3-(4-tert-butylphenyl)-4-(4-ethylphenyl)-5-(4-biphenylyl)-1,2,4-triazole (p-EtTAZ), imidazole derivatives such as TPBI, and phenanthroline derivatives such as bathophenanthroline (BPhen) and bathocuproin (BCP) can be used.

It is preferable that a material that has a large ionization potential and a large band gap is used for the third layer 606 formed on the second layer 605. Specifically, condensed aromatic rings such as perylene derivatives (for example, perylene, alkyl perylene, and aryl perylene), anthracene derivatives (for example, alkyl anthracene and diaryl anthracene), and pyrene derivatives (for example, alkyl pyrene and aryl pyrene) can be used. In addition, metal complexes such as distyrylarylene, silole derivatives, coumarin derivatives, and bis(2-methyl-8-quinolinolato)-(4-hydroxy-biphenylyl)-aluminum (BAlq) can also be used. The materials mentioned above can be used as any of a dopant and a single layer film.

It is preferable that a known highly hole transporting material that is low in crystallity is used for the fourth layer 607 formed on the third layer 606. Specifically, aromatic amine compounds (that is, a compound that has a benzene ring-nitrogen bond) are appropriate, which include 4,4'-bis[N-(3-methylphenyl)-N phenylamino]-biphenyl (TPD) and a derivative thereof such as 4,4'-bis[N-(1-naphthyl)-N-phenyl-amino]-biphenyl (α-NPD), for example. In addition, starburst aromatic amine compounds such as 4,4',4"-tris(N,N-diphenylamino)-triphenylamine (TDATA) and MTDATA can also be used. Further, 4,4',4"-tris(N-carbazolyl)-triphenylamine (abbreviation: TCTA) may be used. Among polymeric materials, a material such as poly(vinylcarbazole) that shows a favorable hole transporting property can be used.

Further, in the present invention, a highly hole injecting benzoxazole derivative or metal oxide that is resistant to etching is used for the fifth layer 608 formed on the fourth layer 607. Both the metal oxide and the benzoxazole derivative may be used. By using the material mentioned above, organic materials included in the first to fourth layers can be prevented from sputter damage when sputtering is later used to form the second electrode 603 on the fifth layer 608. The fifth layer 608 can be formed by evaporation. Further, it is preferable that the fifth layer 608 has a film thickness of 10 nm or more. In order to suppress damage due to sputtering, forming to have this film thickness is effective.

For the fifth layer 608, the metal oxide may be used in combination with a highly hole transporting organic material. The highly hole transporting material includes, for example, an aromatic amine compound (that is, a compound that has a benzene ring-nitrogen bond) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), and 4,4',4"-tris[N-(3-methylphenyl)-N-phenyl-amino]-triphenylamine (abbreviation: MTDATA), without limitation to the materials mentioned here. Another material may be used. With the above-mentioned structure, crystallization of the fifth layer 608 can be suppressed, and then, reliability of the light-emitting element can be enhanced.

Further, in the case of forming the fifth layer 608 to have a film thickness of 100 nm or more, short between the first electrode 601 and the second electrode 603, which is caused due to a factor such as a projection formed at a film surface of the first electrode 601 or the second electrode 603 or a foreign material mixed in between these electrodes, can be suppressed.

As the metal oxide, molybdenum oxide (MoOx), vanadium oxide (VOx), ruthenium oxide (RuOx), and tungsten oxide (WOx), for example, can be used specifically.

In the case of using the benzoxazole derivative for the fifth later 608, it is preferable to use one or more materials of TCNQ, $FeCl_3$, $C_{60}$, and $F_4$-TCNQ in combination with the benzoxazole derivative to enhance the hole injecting property.

In the light-emitting element that has the structure described above, blue or light blue luminescence can be obtained from the third layer 606 when a voltage is applied between the first electrode 601 and the second electrode 603 to supply a current in forward bias to the electroluminescent layer 602. The light from the third layer 606 seems to be light blue since blue light is mixed with green light. To give a specific example, although light obtained from a perylene derivative that is used for the third layer 606 is basically blue, green light is mixed to get closer to a light blue since excimer luminescence is observed with increasing a doping concentration. In the present invention, by transmitting light obtained from the light-emitting element through a coloring layer of a color filter, light in the wavelength range corresponding to a green can be shielded to obtain light that is high in purity of a blue.

Next, another specific example of a light-emitting element of a light-emitting device according to the present invention will be described.

Figure 6B:
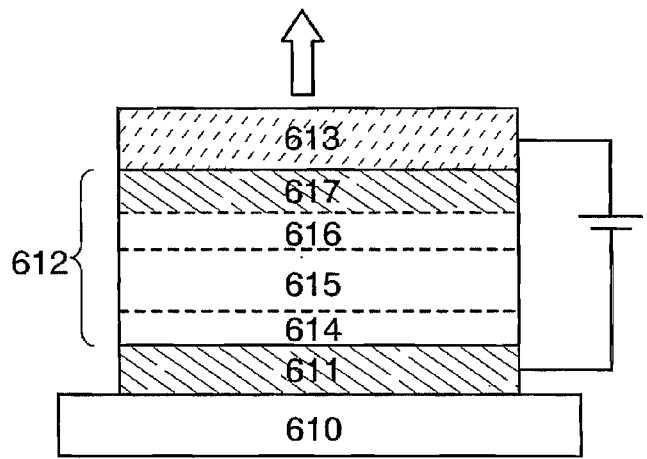

With reference to FIG. 6B, a structure of a light-emitting element from which light in the wavelength range corresponding to a blue can be obtained will be described. The light-emitting element shown in FIG. 6B has, over a substrate 610, a first electrode 611, an electroluminescent layer 612 formed on the first electrode 611, and a second electrode 613 formed on the electroluminescent layer 612. In FIG. 6B, the first electrode 611 serves as a cathode and the second electrode 613 serves as an anode. The electroluminescent layer 612 has first to fourth layers 614 to 617.

It is preferable that a metal, an alloy, an electrically conductive compound, or a mixture of these, which has a small work function and is generally used for a cathode of a light-emitting element is used to form the first electrode 611, like the first electrode 601 in FIG. 6A. In addition, it is preferable that a conductive material that has a large work function is used to form the second electrode 613, like the second electrode 603 in FIG. 6A.

It is preferable that a highly electron injecting material is used for the first layer 614 formed to come in contact with the first electrode 611 that serves as a cathode, like the first layer 604 in FIG. 6A. It is preferable that a highly electron transporting material is used for the second layer 615 formed on the first layer 614, like the second layer 605 in FIG. 6A. It is preferable that a known highly hole transporting material that is low in crystallity is used for the third layer 616 formed on the second layer 615, like the fourth layer 607 in FIG. 6A. In addition, a highly hole injecting benzoxazole derivative or metal oxide that is resistant to etching is used for the fourth layer 617 formed on the third layer 616, like the fifth layer 608 in FIG. 6A.

Depending on the kind of a dopant added to the second layer 615 or the third layer 616, green luminescence is obtained or red luminescence is obtained. In order to obtain green luminescence, a material such as a coumarin derivative, a quinacridone derivative, $Alq_3$, or tris(4-methyl-8-quinolinolato)aluminum ($Almq_3$) may be added to the second layer 615 as a dopant. Other than the materials described above, also in the case of using a triplet material such as a tris (phenylpyridine) iridium complex, green luminescence is obtained. In the case of using the tris(phenylpyridine) iridium complex as a dopant, it is preferable to used a bipolar material as a host, and further, in this case, it is preferable to form a highly hole blocking layer that has a small ionization potential and a large band gap between the first layer 614 and the second layer 615. For forming the highly hole blocking layer, a phenanthroline derivative such as BCP or oligopyridine, for example, can be used specifically.

By applying a current in forward bias to the light-emitting element that has the structure mentioned above, green luminescence is obtained from the second layer 615.

In the light-emitting element that has the structure shown in FIG. 6B, a condensed aromatic compound such as rubrene, a perylene diimide derivative, oligothiophene, a DCM derivative typified by 4,4-dicyanomethylene-2-methyl-6-(4-diarylamino)styryl-2,5-pyran, a 2,5-dicyano-1,4-bis(4-diarylaminostyryl)benzene derivative, a benzocoumarin derivative, a porphyrin-based material such as a platinum octaethylporphyrin complex, or a rare earth metal complex such as a tris(1-benzoylacetonato)(1,10-phenanthroline) europium complex, for example, may be added as a dopant to one of the second layer 615 and the third layer 616 in order to obtain red luminescence.

By applying a current in forward bias to the light-emitting element that has the structure mentioned above, red luminescence is obtained from the second layer 615 or the third layer 616 to which the dopant is added.

Alternatively, a layer including a material that has a large ionization potential and a large band gap, to which the dopant mentioned above, may be provided between the second layer 615 and the third layer 616 to obtain luminescence from the added layer. In this case, it is preferable that a material such as Alq₃ or a 2,5-dicyano-1,4-bis(4-diarylaminostyryl)benzene derivative is used as a host for the added layer.

The above-mentioned red luminescence, in fact, mixed with green light may seem to be orange or yellow. In the present invention, by transmitting light obtained from the light-emitting element through a coloring layer of a color filter, light in the wavelength range corresponding to a green can be shielded to obtain light that is high in purity of a red.

Further, in the present invention, by using a color filter, two colors that have different spectra from each other can also be obtained from light of a spectrum. For example, blue light and green light can be extracted selectively from light of a mixture of a blue color and a green color.

In the case of the light-emitting element that has the structure shown in FIG. 6A, a dopant from which green light can be obtained and a dopant from which blue light can be obtained are added to the third layer 606 in order to obtain light of a mixture of a blue color and a green color. In the case of the light-emitting element that has the structure shown in FIG. 6B, both a dopant from which green light can be obtained and a dopant from which blue light can be obtained are added to the second layer 615 in order to obtain light of a mixture of a blue color and a green color. Alternatively, in the case of the light-emitting element that has the structure shown in FIG. 6A, a dopant from which green light can be obtained may be added to the second layer 605. In addition, in the case of the light-emitting element that has the structure shown in FIG. 6A, light of a mixture of a blue color and a green color due to excimer luminescence can be obtained by using a high concentration of condensed aromatic ring that has small steric hindrance (for example, perylene, perylene derivatives, pyrene derivatives, and anthracene derivatives) as a dopant for the third layer 606.

In the case of the light-emitting element that has the structure shown in FIG. 6B, in order to obtain light of a mixture of a red color and a green color, an electron transporting host such as a metal quinolinole complex typified by Alq₃ may be used for the second layer 615, and a dopant from which red light can be obtained may further be added to the second layer 615. In the case of the light-emitting element that has the structure shown in FIG. 6A, a bipolar host may be used for the third layer 606, and a dopant from which green light can be obtained may further be added to the third layer 606. Further, an electron transporting host may be used for the second layer 605, and a dopant from which red light can be obtained may further be added to the second layer 605.

In each case of FIGS. 6A and 6B, the first electrode serves as a cathode and the second electrode serves as an anode. However, the first electrode and the second electrode may serve as an anode and a cathode, respectively.

Figure 6C:
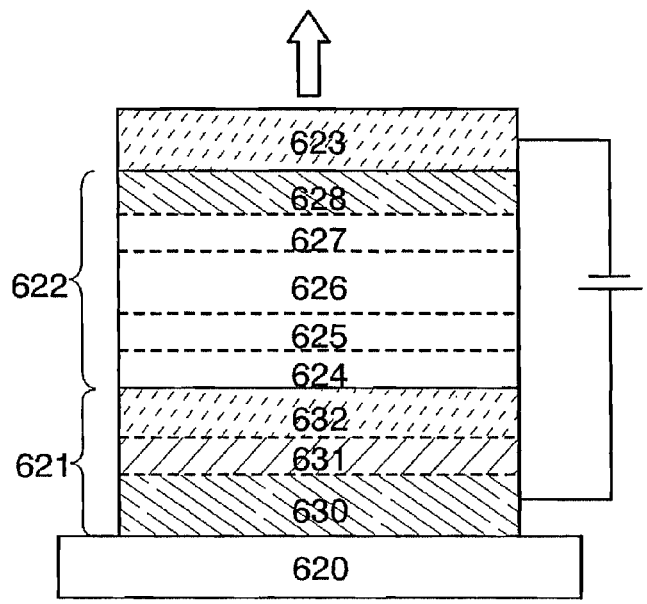

FIG. 6C shows a structure of a light-emitting element as an example, where a first electrode serves as an anode and a second electrode serves as a cathode. The light-emitting element shown in FIG. 6C has, over a substrate 620, a first electrode 621, an electroluminescent layer 622 formed on the first electrode 621, and a second electrode 623 formed on the electroluminescent layer 622. In FIG. 6C, the first electrode 621 serves as an anode and the second electrode 623 serves as a cathode.

In the case of FIG. 6C, in addition to a single layer film including one or more of materials such as TiN, ZrN, Ti, W, Ni, Pt, Cr, and Ag, a lamination layer including a titanium nitride film and a film containing aluminum as its main component, and a three-layer structure including a titanium nitride film, a film containing aluminum as its main component, and a titanium nitride film can be used as the first electrode 621. Further, a transparent conductive film such as ITO, ITSO, or IZO may be laminated on the above-mentioned material that can reflect light for use as the first electrode 621. In FIG. 6C, an Al—Si film 630, a Ti film 631, and an ITO film 632 are laminated in this order over the glass substrate 620 to form the first electrode 621.

Further, as the second electrode 623, a transparent conductive film such as ITO, IZO, ITSO is used.

The electroluminescent layer 622 has a plurality of layers like FIG. 6A or 6B. However, the order of laminating the respective layers is reverse in FIG. 6C. FIG. 6C shows a case where the electroluminescent layer 622 has first to fifth layers 624 to 628.

It is preferable that a material that has a relatively small ionization potential is used for the first layer 624 formed to come in contact with the first electrode 621 that serves as an anode. The material is roughly classified into metal oxides, a low molecular weight organic compound, or a high molecular weight organic compound. In the case of the metal oxide, vanadium oxide, molybdenum oxide, ruthenium oxide, and aluminum oxide, for example, can be used. In the case of the low molecular weight organic compound, starburst amines typified by m-MTDATA, metal phthalocyanines typified by copper phthalocyanine (abbreviation: CuPc), phthalocyanine (abbreviation: H₂Pc), and 2,3-dioxyethylenethiophene derivatives for example, can be used. The low molecular weight organic compound and the metal oxide described above may be co-evaporated to form the first layer 624. In the case of the high molecular weight organic compound, polymers such as polyanilines (abbreviation: PAni), polyvinyl carbazoles (abbreviation: PVA), and polythiophene derivatives can be used. Polyethylene dioxythiophene (abbreviation: PEDOT) that is one of the polythiophene derivatives, which is doped with polystyrene sulfonate (abbreviation: PSS) may be used. A benzoxazole derivative and one or more materials of TCNQ, FeCl₃, C₆₀, and F₄-TCNQ may be used in combination.

It is preferable that a known highly hole transporting material that is low in crystallity is used for the second layer 625 formed on the first layer 624. Specifically, the materials that can be used for the fourth layer 607 in FIG. 6A can be used in the same way.

It is preferable that a material that has a large ionization potential and a large band gap is used for the third layer 626 formed on the second layer 625. Specifically, the materials that can be used for the third layer 606 in FIG. 6A can be used in the same way.

It is preferable that a highly electron transporting material is used for the fourth layer 627 formed on the third layer 626. Specifically, the materials that can be used for the second layer 605 in FIG. 6A can be used in the same way.

In addition, in the present invention, a benzoxazole derivative or a metal oxide that is resistant to etching is used for the fifth layer 628 formed on the fourth layer 627. In addition, in order to enhance an electron injecting property, one or more materials of an alkali metal, an alkali earth metal, and a transition metal is used in combination with the material mentioned above. Both the metal oxide and the benzoxazole derivative may be used. By using the material mentioned above, organic materials included in the first to fourth layers can be prevented from sputter damage when sputtering is later used to form the second electrode 623 on the fifth layer 628. The fifth layer 628 can be formed by evaporation. Further, it is preferable that the fifth layer 628 has a film thickness of 10 nm or more. In order to suppress damage due to sputtering, forming to have this film thickness is effective.

Further, in the case of forming the fifth layer 628 to have a film thickness of 100 nm or more, short between the first electrode 621 and the second electrode 623, which is caused due to a factor such as a projection formed at a film surface of the first electrode 621 or the second electrode 623 or a foreign material mixed in between these electrodes, can be suppressed.

As the metal oxide, molybdenum oxide (MoOx), vanadium oxide (VOx), ruthenium oxide (RuOx), and tungsten oxide (WOx), for example, can be used specifically.

In the light-emitting element shown in FIG. 6C, as in FIG. 6B, luminescence may be obtained from the second layer 625 or the fourth layer 627 by adding a dopant without providing the third layer 626.

Embodiment 4

In the present embodiment, a form will be described, which is a structure of a pixel of a light-emitting device according to the present invention.

Figure 7:
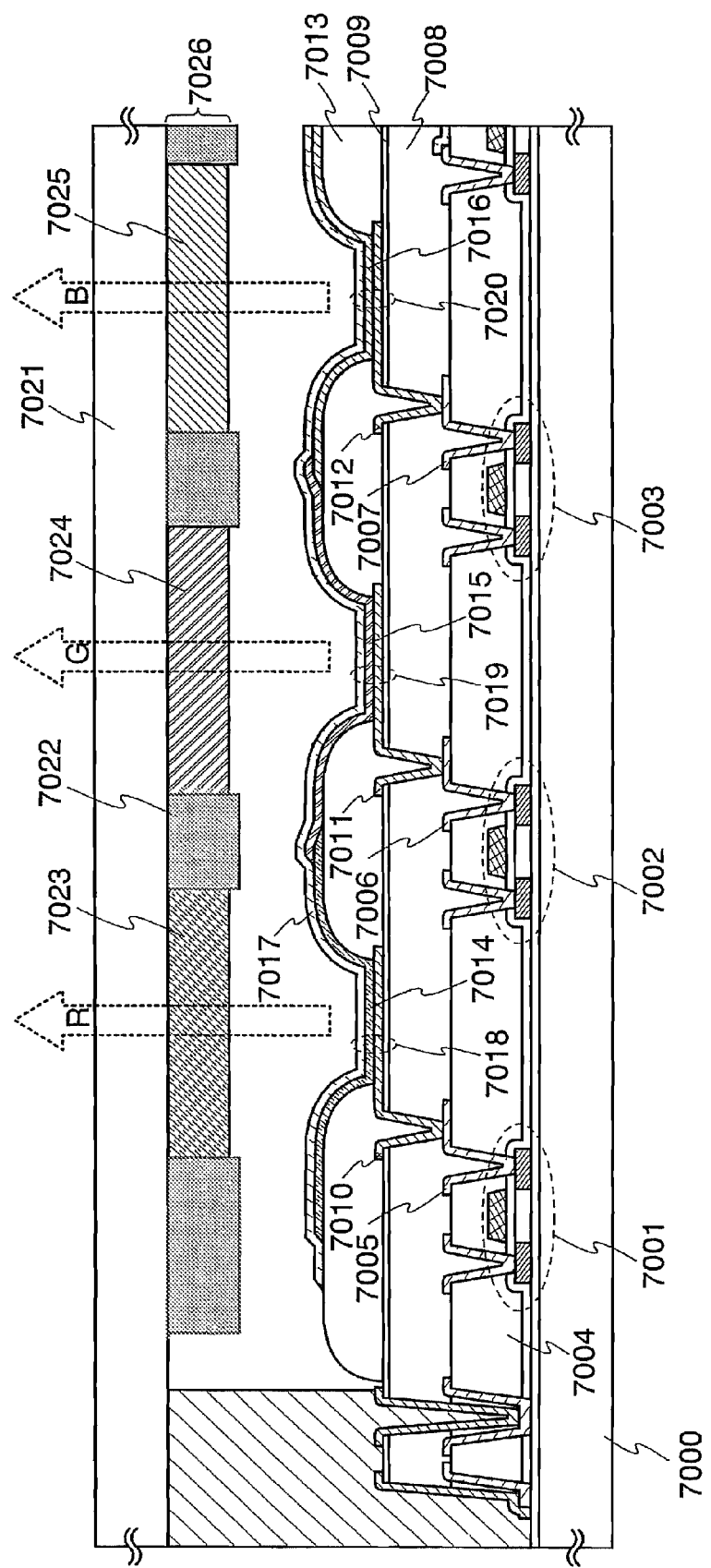
FIG. 7 is a cross-sectional view of a light-emitting device according to the present invention.

FIG. 7 shows a cross-sectional view of a light-emitting device in the present embodiment. In FIG. 7, transistors 7001 to 7003 are formed over a substrate 7000. The transistors 7001 to 7003 are covered with a first interlayer insulating film 7004, and wirings 7005 to 7007 are formed on the first interlayer insulating film 7004, which are electrically connected to drains of the transistors 7001 to 7003 through contact holes, respectively.

Further, a second interlayer insulating film 7008 and a third interlayer insulating film 7009 are laminated on the first interlayer insulating film 7004 to cover the wirings 7005 to 7007. For the first interlayer insulating film 7004 and the second interlayer insulating film 7008, an organic resin film, an inorganic insulating film, and an insulating film including a Si—O bond and a Si—CHx bond, which is formed by using a material including a siloxane material as a starting material, for example can be used. In the present embodiment, a non-photoseneitive acrylic is used. As the third interlayer insulating film 7009, a film that hardly allows permeation of a material such as moisture or oxygen, which is a cause to promote deterioration of a light-emitting element, as compared with other insulating films, is used. Typically, it is preferable to use a DLC film, a carbon nitride film, or a silicon nitride film formed by RF sputtering, for example.

On the third interlayer insulating film 7009, wirings 7010 to 7012 are formed, which are electrically connected to the wirings 7005 to 7007 through contact holes respectively. A portion of each of the wirings 7010 to 7012 functions as a first electrode of a light-emitting element. In FIG. 7, unlike the pixel shown in FIG. 2, the first electrode and the wiring electrically connected to the TFT are formed in different layers. Therefore, the first electrode can be arranged to have a larger area, hence a light-emitting element is allowed to have a larger region from which light can be obtained.

Further, a film such as an insulating film including a Si—O bond and a Si—CHx bond, which is formed by using a material including a siloxane material as a starting material, an organic resin film, or inorganic insulating film is used to form a partition 7013 on the third interlayer insulating film 7009. The partition 7013 has openings, and the wirings 7010 to 7012 that function as the first electrodes, electroluminescent layers 7014 to 7016, and a second electrode 7017 are overlapped in the openings to form light-emitting elements 7018 to 7020, respectively. Each of the electroluminescent layers 7014 to 7016 has a laminated structure including a plurality of layers. A protective film may be formed on the partition 7013 and the second electrode 7017. In this case, a film that hardly allows permeation of a material such as moisture or oxygen, which is a cause to promote deterioration of a light-emitting element, as compared with other insulating films, is used as the protective film. Typically, it is preferable to use a DLC film, a carbon nitride film, or a silicon nitride film formed by RF sputtering, for example. In addition, as the protective film, it is also possible to use a laminate film including the above-mentioned film that hardly allows permeation of a material such as moisture or oxygen and a film that easily allows permeation of a material such as moisture or oxygen as compared with the above-mentioned film.

Before deposition of the electroluminescent layers 7014 to 7016, the partition 7013 is heated in an atmosphere of a vacuum in order to remove adsorbed moisture or oxygen. Specifically, a heat treatment is performed in an atmosphere of a vacuum at 100° C. to 200° C. for approximately 0.5 to 1 hour. Preferably, the vacuum is $3 \times 10^{-7}$ Torr or less, and it is most preferable to be preferably $3 \times 10^{-8}$ Torr or less if possible. In the case where the electroluminescent layers 7014 to 7016 are deposited after performing a heat treatment in an atmosphere of a vacuum to the partition 7013, reliability can further enhanced by keep the atmosphere of the vacuum until just before the deposition.

It is preferable that an edge of the partition 7013 in the opening is rounded to prevent a hole from being made in the electroluminescent layers 7014 to 7016 formed on the partition 7013 to partially overlap. Specifically, it is preferable that a curve described by a cross section of the partition 7013 in the opening has a curvature radius of 0.2 to 2 μm.

With the above-mentioned structure, the electroluminescent layers 7014 to 7016 and the second electrode 7017, which are later formed, can have favorable coverages, and the wirings 7010 to 7012 and the second electrode 7017 can be prevented from being shorting out at a hole made in the electroluminescent layers 7014 to 7016. Further, by stress relaxation for the electroluminescent layers 7014 to 7016, a defect of a reduced light-emitting region, which is referred to as shrinking, can be reduced, hence reliability can be enhanced.

FIG. 7 shows an example of using a positive photosensitive acrylic resin as the partition 7013. A photosensitive organic resin is classified into a positive photosensitive organic resin in which a portion exposed by an energy line such as light, electrons, or ions is removed or a negative photosensitive organic resin in which an exposed portion is left. In the present invention, a negative organic resin film may be used. A photosensitive polyimide may be used to form the partition 7013. In the case of using a negative acrylic to form the partition 7013, an edge in the opening has a S-shaped cross section. In this case, it is preferable that a top portion and a bottom portion in the opening have a curvature radius of 0.2 to 2 μm.

For the wirings 7010 to 7012, a material that transmits no light is used, and for planarization of surfaces thereof, polishing may be performed by CMP or cleaning with a polyvinyl-alcohol-based porous material may be performed. After polishing by CMP, the surfaces of the wirings 7010 to 7012 may be subjected to a treatment such as ultraviolet irradiation and oxygen plasma treatment.

Further, reference numeral 7021 denotes a covering material for sealing of the light-emitting elements 7018 to 7020, which has a light-transmitting property. Adjacent to the covering material 7021, a shielding film 7022 for shielding visible light and a color filter 7026 that has coloring layers 7023 to 7025 corresponding to pixels corresponding to respective colors are formed. In the case of FIG. 7, light in the wavelength range corresponding to a red, of light emitted from the light-emitting element 7018, is selectively transmitted through the coloring layer 7023, light in the wavelength range corresponding to a green, of light emitted from the light-emitting element 7019, is selectively transmitted through the coloring layer 7024, and light in the wavelength range corresponding to a blue, of light emitted from the light-emitting element 7020, is selectively transmitted through the coloring layer 7025.

In FIG. 7, a black pigment and a desiccant are dispersed in a resin to form the shielding film 7022. With this structure, deterioration of the light-emitting elements can be prevented.

The shielding film 7022 is arranged to overlap a portion between the light-emitting elements, such as a portion between the light-emitting elements 7018 and 7019 and a portion between the light-emitting elements 7019 and 7020, and is able to prevent light from the light-emitting element from being transmitted through the coloring layer corresponding to the adjacent pixel.

In FIG. 7, the electroluminescent layer 7014, 7015, or 7016 that has a different electroluminescent material included or a different element structure is used depending on the pixel corresponding to each color. However, the present invention is not always limited to this structure. In at least pixels corresponding to two colors respectively, electroluminescent layers that have different electroluminescent materials included or different element structures from each other are used respectively.

In the present invention, a transparent conductive film such as ITO, ITSO, or IZO, mentioned above, is used for the second electrode 7017 formed on the electroluminescent layers 7014 to 7016, which is formed by sputtering. In each of the electroluminescent layers 7014 to 7016, the top layer in contact with the second electrode 7017 includes at least one of a metal oxide and a benzoxazole derivative.

Figure 8:
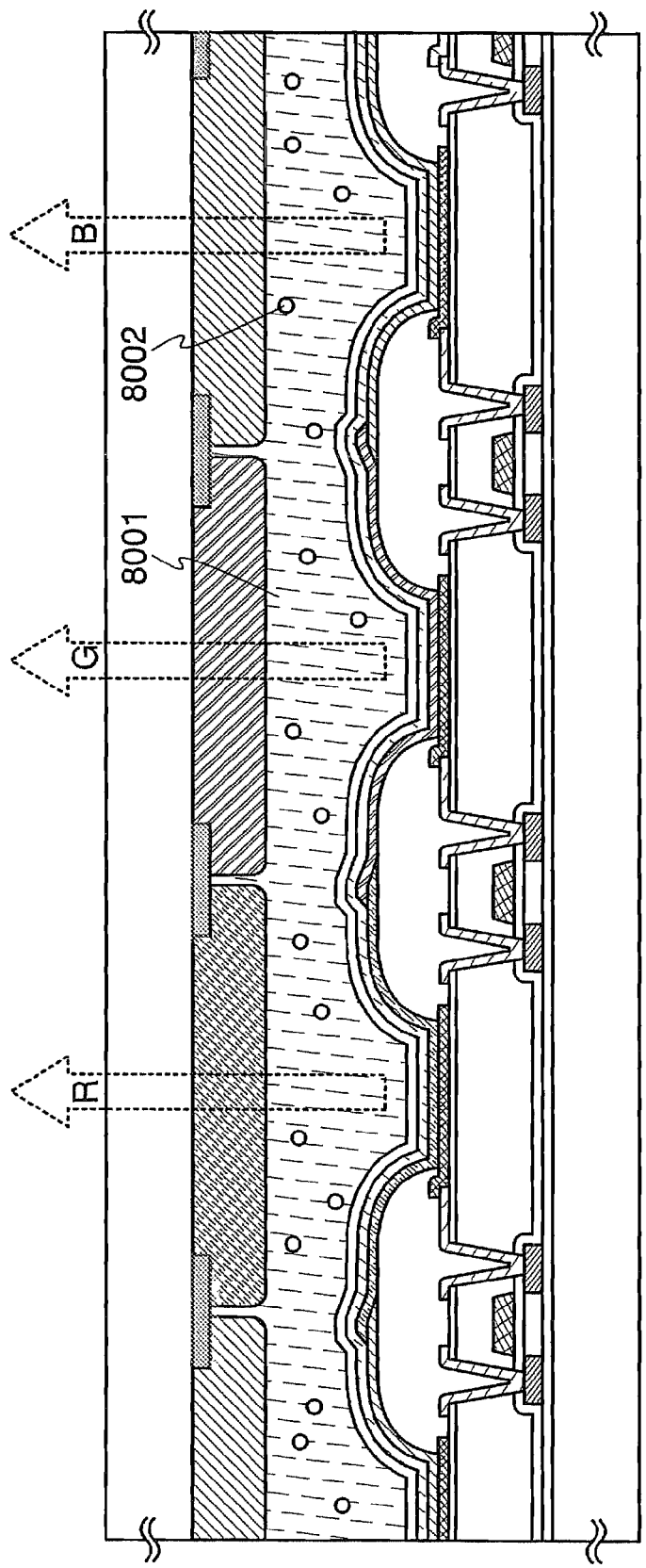
FIG. 8 is a cross-sectional view of a light-emitting device according to the present invention.

An enclosed space formed by the covering material 7021 and the substrate 7000 may be filled with an inert gas or a resin, or a hygroscopic material (barium oxide, for example) may be arranged inside. FIG. 8 shows a state of the light-emitting device shown in FIG. 2, where the enclosed space formed by the substrate and the covering material is filled with a resin 8001 in which a desiccant 8002 is dispersed. As shown in FIG. 8, reliability of the light-emitting element is improved by dispersing the desiccant inside.

Figure 9:
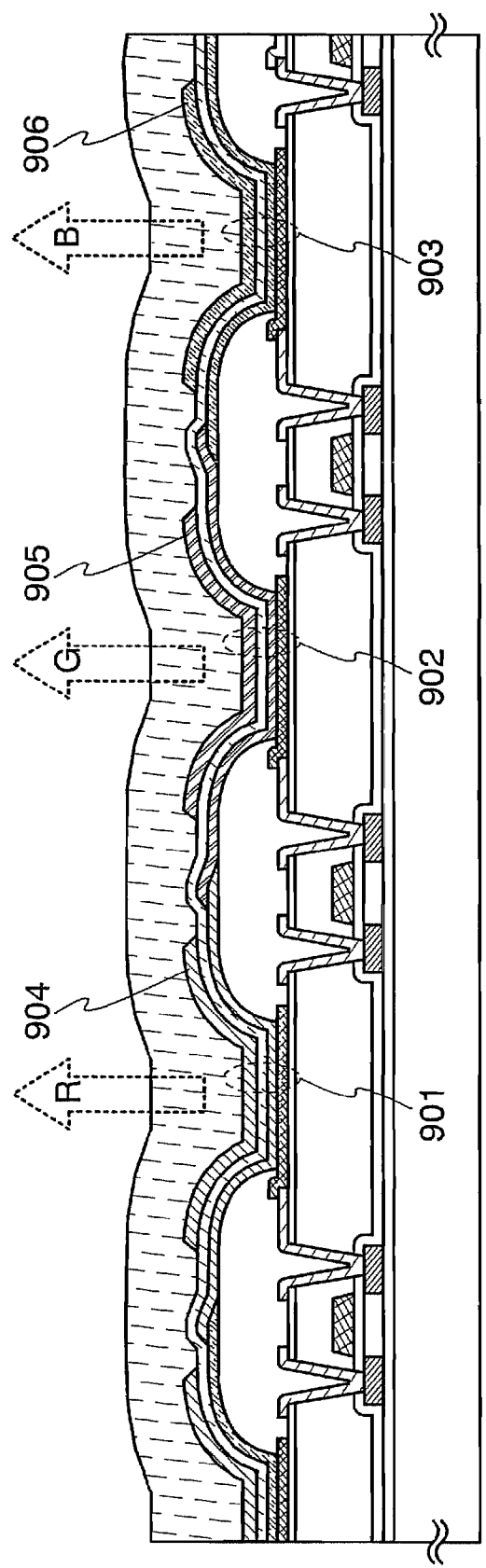
FIG. 9 is a cross-sectional view of a light-emitting device according to the present invention.

In each of FIGS. 2 and 8, the color filter is provided adjacent to the covering material. However, the present invention is not limited to this structure. For example, as shown in FIG. 9, coloring layers 904 to 906 may be formed by a method such as inkjet to overlap with light-emitting elements 901 to 903. In this case, for sealing of the light-emitting elements 901 to 903, a resin can be used instead of a covering material. Therefore, a light extraction efficiency can be enhanced as compared with a case of providing a covering material.

The present invention is not limited to the manufacturing method mentioned above. A known method can be used to manufacture the light-emitting device according to the present invention.

Embodiment 5

A transistor that is used for a light-emitting device according to the present invention may be a TFT using a polycrystalline semiconductor or a TFT using an amorphous or semi-amorphous semiconductor. In the present embodiment, a structure of a TFT formed by using an amorphous semiconductor or a semi-amorphous semiconductor will be described.

FIG. 10A shows a cross-sectional view of a TFT that is used in a driver circuit and a cross-sectional view of a TFT that is used in a pixel portion. Reference numeral 1001 denotes the cross-sectional view of the TFT that is used in the driver circuit, reference numeral 1002 denotes the cross-sectional view of the TFT that is used in the pixel portion, and reference numeral 1003 denotes a cross-sectional view of a light-emitting element to which a current is supplied by the TFT 1002. The TFTs 1001 and 1002 are inversely staggered TFTs (bottom-gate TFTs).

The TFT 1001 of the driver circuit has a gate electrode 1010 formed over a substrate 1000, a gate insulating film 1011 covering the gate electrode 1010, a first semiconductor film 1012 formed to include a semi-amorphous semiconductor or an amorphous semiconductor, which is overlapped with the gate electrode 1010 while the gate insulating film 1011 is interposed in between. Further, the TFT 1001 has a pair of second semiconductor films 1013 that function as a source region and a drain region and a third semiconductor film 1014 provided between the first semiconductor film 1012 and each of the second semiconductor films 1013.

In FIG. 10A, the gate insulating film 1011 has two layers of insulating films. However, the present invention is not limited to this structure. The gate insulating film 1011 may have a single-layered insulating film or three or more layers of insulating films.

The second semiconductor films 1013 are formed to include an amorphous semiconductor or a semi-amorphous semiconductor, and doped with an impurity that imparts one conductivity type. The pair of second semiconductor films 1013 is faced with each other while a channel forming region of the first semiconductor film 1012 is interposed in between.

The third semiconductor film 1014 is formed to include an amorphous semiconductor or a semi-amorphous semiconductor, has the same conductivity type as that of the second semiconductor films 1013, and has a property of having a lower conductivity than the second semiconductor film 1013. Since the third semiconductor film 1014 functions as an LDD region, an electric field concentrated at an edge of the second semiconductor film 1013 that functions as a drain region is reduced to enable preventing hot carrier effect. It is not always necessary to provide the third semiconductor film 1014. However, by providing the third semiconductor film 1014, it is possible to enhance withstand voltage of the TFT and improve reliability. In the case where the TFT 1001 is an n-type TFT, n-type conductivity can be obtained without particular doping with an impurity that imparts n-type conductivity in forming the third semiconductor film 1014. Therefore, in the case where the TFT 1001 is an n-type TFT, it is not always necessary to dope the third semiconductor film 1014 with an n-type impurity. However, in this case, the first semiconductor film 1012 where a channel is formed is doped with an impurity that imparts p-type conductivity to control the conductivity type so as to be closer to an i-type semiconductor as much as possible.

Further, two wirings 1015 are formed to come in contact with the pair of second semiconductor films 1013. One of the wirings 1015 is connected to an IC chip 1051 through an anisotropic conductive resin 1050. In order to form the IC chip 1051, a single-crystal semiconductor may be used or a poly crystalline semiconductor formed over a glass substrate may be used. By arranging the IC chip 1051 to be overlapped with a sealing material 1052 that is used for sealing of a light-emitting element, a region at the periphery of the pixel portion can be reduced in size.

The TFT 1002 of the pixel portion has a gate electrode 1020 formed over a substrate 1000, the gate insulating film 1011 covering the gate electrode 1020, a first semiconductor film 1022 formed to include a semi-amorphous semiconductor or an amorphous semiconductor, which is overlapped with the gate electrode 1020 while the gate insulating film 1011 is interposed in between. Further, the TFT 1002 has a pair of second semiconductor films 1023 that function as a source region and a drain region and a third semiconductor film 1024 provided between the first semiconductor film 1022 and each of the second semiconductor films 1023.

The second semiconductor films 1023 are formed to include an amorphous semiconductor or a semi-amorphous semiconductor, and doped with an impurity that imparts one conductivity type. The pair of second semiconductor films 1023 is faced with each other while a channel forming region of the first semiconductor film 1022 is interposed in between.

The third semiconductor film 1024 is formed to include an amorphous semiconductor or a semi-amorphous semiconductor, has the same conductivity type as that of the second semiconductor films 1023, and has a property of having a lower conductivity than the second semiconductor film 1023. Since the third semiconductor film 1024 functions as an LDD region, an electric field concentrated at an edge of the second semiconductor film 1023 that functions as a drain region is reduced to enable preventing hot carrier effect. It is not always necessary to provide the third semiconductor film 1024. However, by providing the third semiconductor film 1024, it is possible to enhance withstand voltage of the TFT and improve reliability. In the case where the TFT 1002 is an n-type TFT, n-type conductivity can be obtained without particular doping with an impurity that imparts n-type conductivity in forming the third semiconductor film 1024. Therefore, in the case where the TFT 1002 is an n-type TFT, it is not always necessary to dope the third semiconductor film 1024 with an n-type impurity. However, in this case, the first semiconductor film 1022 where a channel is formed is doped with an impurity that imparts p-type conductivity to control the conductivity type so as to be closer to an i-type semiconductor as much as possible.

Further, wirings 1025 are formed to come in contact with the pair of second semiconductor films 1023.

In addition, a first passivation film 1040 and a second passivation film 1041 that are insulating films are formed to cover the TFTs 1001 and 1002 and the wirings 1015 and 1025. Other than the two layers, the passivation film covering the TFTs 1001 and 1002 may be a single layer or may have three layers or more. For example, the first passivation film 1040 can be formed to include silicon nitride, and the second passivation film 1041 can be formed to include silicon oxide. By forming the passivation film to include silicon nitride or silicon oxynitride, the TFTs 1001 and 1002 can be prevented from being degraded due to moisture or oxygen.

One of the wirings 1025 is connected to a first electrode 1030 of the light-emitting element 1003. Further, an electroluminescent layer 1031 is formed to come in contact with the first electrode 1030, and a second electrode 1032 is formed to come in contact with the electroluminescent layer 1032.

Next, a structure of a TFT of a light-emitting device according to the present invention, which is different from FIG. 10A, will be described. FIG. 10B shows a cross-sectional view of a TFT that is used in a driver circuit and a cross-sectional view of a TFT that is used in a pixel portion. Reference numeral 1101 denotes the cross-sectional view of the TFT that is used in the driver circuit, reference numeral 1102 denotes the cross-sectional view of the TFT that is used in the pixel portion, and reference numeral 1103 denotes a cross-sectional view of a light-emitting element to which a current is supplied by the TFT 1102.

The TFT 1101 of the driver circuit and the TFT 1102 of the pixel portion respectively have gate electrodes 1110 and 1120, a gate insulating film 1111 covering the gate electrodes 1110 and 1120, and first semiconductor films 1112 and 1122 formed to include a semi-amorphous semiconductor or an amorphous semiconductor, which are respectively overlapped with the gate electrodes 1110 and 1120 while the gate insulating film 1111 is interposed in between. In addition, channel protective films 1160 and 1161 that are insulating films are formed to cover channel forming regions of the first semiconductor films 1112 and 1122, respectively. The channel protective films 1160 and 1161 are provided for preventing the channel forming regions of the first semiconductor films 1112 and 1122 from being etched in manufacturing processes of the TFTs 1101 and 1102, respectively. Further, the TFT 1101 has a pair of second semiconductor films 1113 that function as a source region and a drain region and a third semiconductor film 1114 provided between the first semiconductor film 1112 and each of the second semiconductor films 1113, and the TFT 1102 has a pair of second semiconductor films 1123 that function as a source region and a drain region and a third semiconductor film 1124 provided between the first semiconductor film 1122 and each of the second semiconductor films 1123.

In FIG. 10B, the gate insulating film 1111 has two layers of insulating films. However, the present invention is not limited to this structure. The gate insulating film 1111 may have a single-layered insulating film or three or more layers of insulating films.

The second semiconductor films 1113 and 1123 are formed to include an amorphous semiconductor or a semi-amorphous semiconductor, and doped with an impurity that imparts one conductivity type. The pair of second semiconductor films 1113 is faced with each other while the channel forming region of the first semiconductor film 1112 is interposed in between, and the pair of second semiconductor films 1123 is faced with each other while the channel forming region of the first semiconductor film 1122 is interposed in between.

The third semiconductor films 1114 and 1124 are formed to include an amorphous semiconductor or a semi-amorphous semiconductor, have the same conductivity type as those of the second semiconductor films 1113 and 1123, and have a property of having a lower conductivity than the second semiconductor films 1113 and 1123, respectively. Since the third semiconductor films 1114 and 1124 respectively function as LDD regions, electric fields respectively concentrated at edges of the second semiconductor films 1113 and 1123 that respectively function drain regions are reduced to enable preventing hot carrier effect. It is not always necessary to provide the third semiconductor films 1114 and 1124. However, by providing the third semiconductor films 1114 and 1124, it is possible to enhance withstand voltage of the TFTs and improve reliability. In the case where the TFTs 1101 and 1102 are n-type TFTs, n-type conductivity can be obtained without particular doping with an impurity that imparts n-type conductivity in forming the third semiconductor films 1114 and 1124. Therefore, in the case where the TFTs 1101 and 1102 are n-type TFTs, it is not always necessary to dope the third semiconductor films 1114 and 1124 with an n-type impurity. However, in this case, the first semiconductor films 1112 and 1122 where a channel is formed are doped with an impurity that imparts p-type conductivity to control the conductivity type so as to be closer to an i-type semiconductor as much as possible.

Further, two wirings 1115 and two wirings 1125 are formed to come in contact with the pair of the second semiconductor films 1113 and the pair of the second semiconductor films 1123, respectively. One of the wirings 1115 is connected to an IC chip 1151 through an anisotropic conductive resin 1150. In order to form the IC chip 1151, a single-crystal semiconductor may be used or a poly crystalline semiconductor formed over a glass substrate may be used. By arranging the IC chip 1151 to be overlapped with a sealing material 1152 that is used for sealing of a light-emitting element, a region at the periphery of the pixel portion can be reduced in size.

In addition, a first passivation film 1140 and a second passivation film 1141 that are insulating films are formed to cover the TFTs 1101 and 1102 and the wirings 1115 and 1125. Other than the two layers, the passivation film covering the TFTs 1101 and 1102 may be a single layer or may have three layers or more. For example, the first passivation film 1140 can be formed to include silicon nitride, and the second passivation film 1141 can be formed to include silicon oxide. By forming the passivation film to include silicon nitride or silicon oxynitride, the TFTs 1101 and 1102 can be prevented from being degraded due to moisture or oxygen.

One of the wirings 1125 is connected to a first electrode 1130 of the light-emitting element 1103. Further, an electroluminescent layer 1131 is formed to come in contact with the first electrode 1130, and a second electrode 1132 is formed to come in contact with the electroluminescent layer 1131.

The present embodiment describes an example where a driver circuit and a pixel portion of a light-emitting device are formed over one substrate with the use of a TFT using a semi-amorphous semiconductor or an amorphous semiconductor. However, the present invention is not limited to this structure. When a pixel portion is formed with the use of a TFT using a semi-amorphous semiconductor or an amorphous semiconductor, a separately formed driver circuit may be attached to the substrate over which a pixel portion is formed.

Figure 11A:
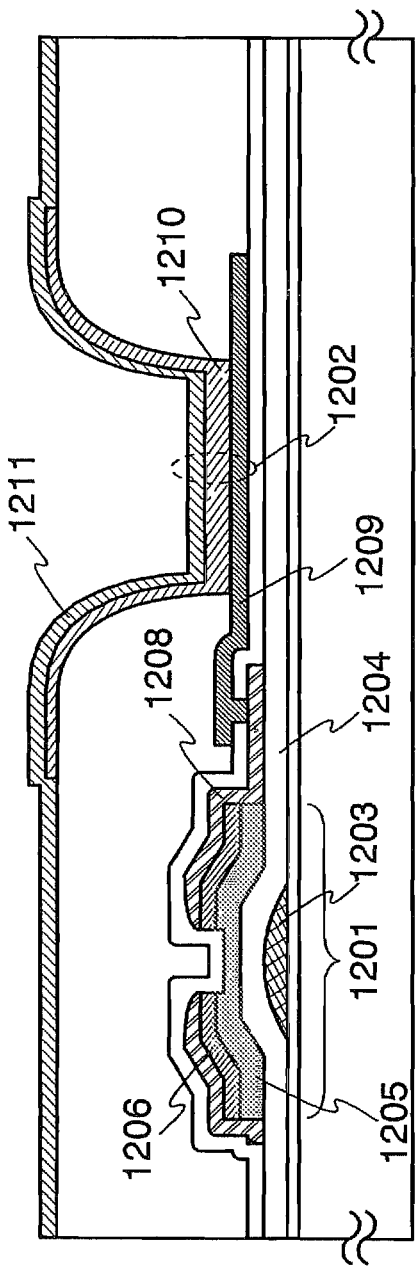
FIGS. 11A and 11B are cross-sectional views of light-emitting devices according to the present invention.

Besides, a component such as a gate electrode or a wiring may be formed by inkjet. FIG. 11A shows a cross-sectional of a pixel formed by using inkjet as an example. In FIG. 11A, reference numeral 1201 denotes a bottom-gate TFT, which is electrically connected to a light-emitting element 1202. The TFT 1201 has a gate electrode 1203, a gate insulating film 1204 formed on the gate electrode 1203, a first semiconductor film 1205 formed on the gate insulating film 1204, and a second semiconductor film 1206 formed on the first semiconductor film 1205. The first semiconductor film 1205 functions as a channel forming region. The second semiconductor film 1206 is doped with an impurity that imparts one conductivity type to function as a source or a drain.

In addition, a wiring 1208 is formed to come in contact with the second semiconductor film 1206, and the wiring 1208 is connected to a first electrode 1209 of the light-emitting element 1202. The light-emitting element 1202 has the first electrode 1209, an electroluminescent layer 1210 formed on the first electrode 1209, and a second electrode 1211 formed on the electroluminescent layer 1210.

In the case of a light-emitting device shown in FIG. 11A, components such as the gate electrode 1203, the wiring 1208, the first electrode 1209, the electroluminescent layer 1210, a mask that is used for pattern formation can be formed by inkjet.

Figure 11B:
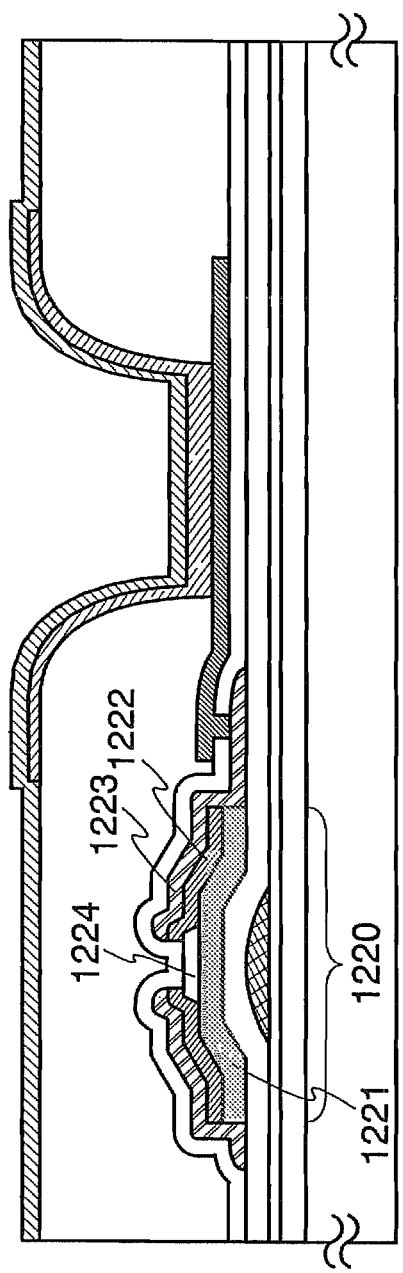

FIG. 11B also shows a cross-sectional of a pixel formed by using inkjet as an example. In FIG. 11B, an insulating film (an etching stopper) 1224 that is able to prevent a first semiconductor film 1221 from being etched in patterning of a second semiconductor film 1222 and a wiring 1223 is formed on a first semiconductor film 1221 of a bottom-gate TFT 1220.

Embodiment 6

In a light-emitting device according to the present invention, a transparent conductive film is used as a second electrode that is formed on an electroluminescent layer. In general, a transparent conductive film typified by ITO, ITSO, and IZO tends to have a lower conductivity as compared to a metal such as Al. When the second electrode has a higher sheet resistance, a luminance is decreased due to a voltage drop, which is unfavorable. Consequently, in the present invention, in order to suppress the voltage drop, a material that has a higher conductivity than the second electrode may be used to form an auxiliary electrode on the second electrode.

Figure 12:
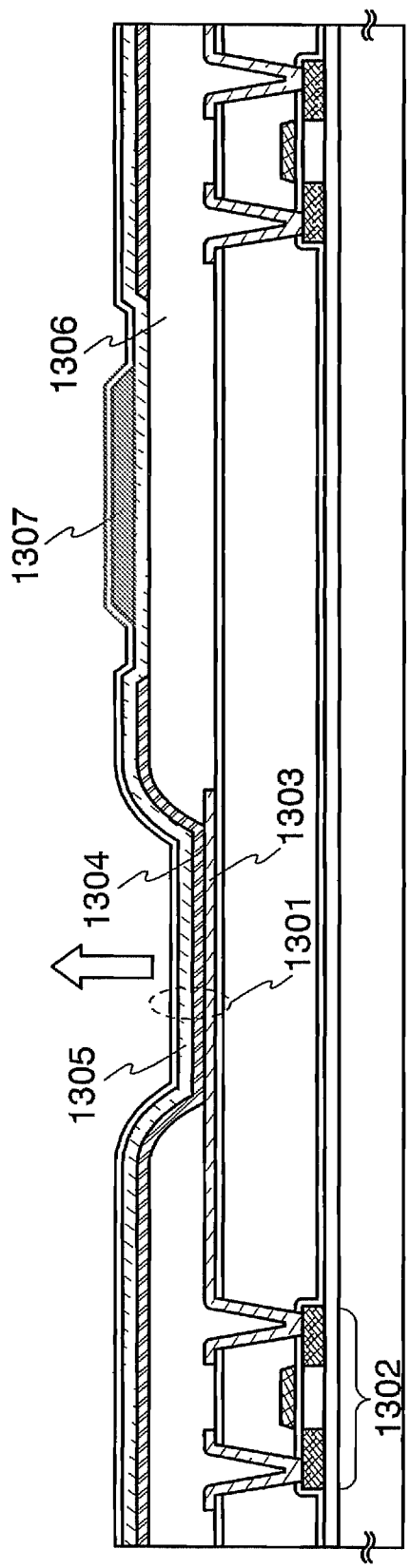
FIG. 12 is a cross-sectional view of a light-emitting device according to the present invention.

FIG. 12 shows a cross-sectional view of a light-emitting device according to the present invention, where an auxiliary electrode is formed. In FIG. 12, reference numeral 1301 denotes a light-emitting element, and reference numeral 1302 denotes a transistor for supplying a current to the light-emitting element 1301. In addition, reference numerals 1303, 1304, and 1305 denote a first electrode, an electroluminescent layer, and a second electrode, respectively. In an opening of a partition 1306, a portion where the first electrode 1303, the electroluminescent layer 1304, and the second electrode 1305 are overlapped with each other corresponds to the light-emitting element 1301.

The second electrode 1305 is formed to include a transparent conductive film typified by ITO, ITSO, and IZO, and has a light-transmitting property. On the second electrode 1305, an auxiliary electrode 1307 is further formed. Specifically, the auxiliary electrode 1307 is formed in a region overlapped with the partition 1306.

The combined resistance of the second electrode 1305 and the auxiliary electrode 1307 is lower than the resistance of only the second electrode 1305. Accordingly, a luminance can be prevented from being decreased due to a voltage drop by forming the auxiliary electrode 1307.

Embodiment 7

Figure 13A:
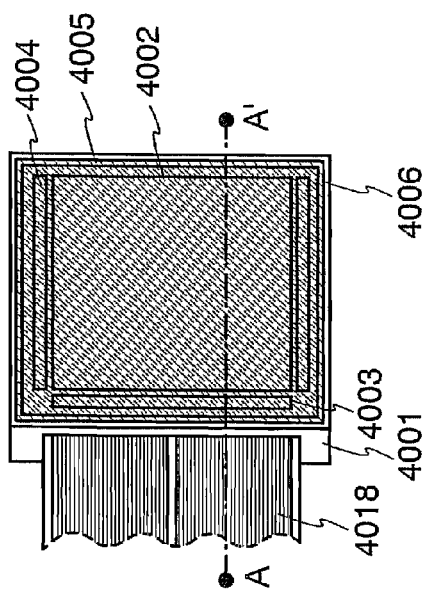
FIGS. 13A and 13 B are a top view and a cross-sectional view of a light-emitting device according to the present invention.
Figure 13B:
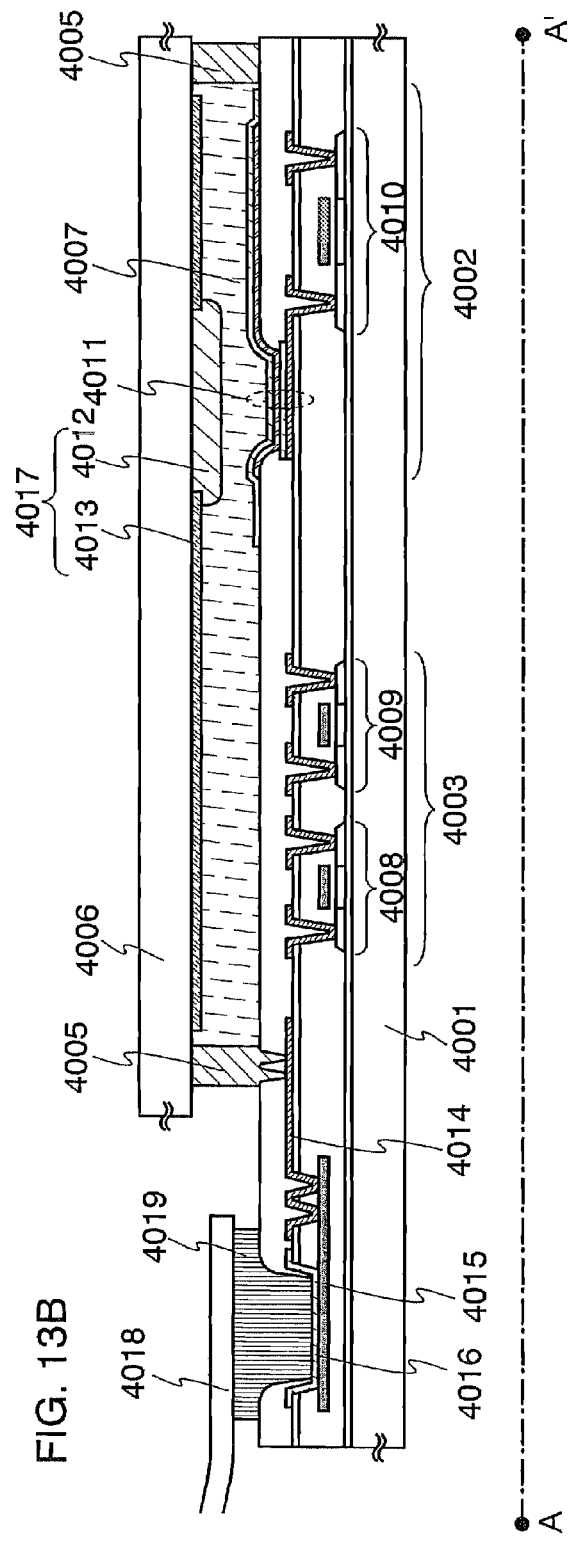

In the present embodiment, an appearance of a panel corresponding to a form of a light-emitting device according to the present invention will be described with reference to FIGS. 13A and 13B. FIG. 13A is a top view of a panel in which a transistor and a light-emitting element that are formed over a substrate are encapsulated between a covering material and the substrate with a sealing material, and FIG. 13B corresponds to a cross-sectional view taken along line A-A' in FIG. 14A.

A sealing material 4005 is provided to surround a pixel portion 4002, a signal line driver circuit 4003, and a scan line driver circuit 4004 that are provided over a substrate 4001. Further, a cover material 4006 is provided over the pixel portion 4002, the signal line driver circuit 4003, and the scan line driver circuit 4004. Accordingly, the pixel portion 4002, the signal line driver circuit 4003, and the scan line driver circuit 4004 are encapsulated together with a filling material 4007 by the substrate 4001, the sealing material 4005, and the covering material 4006.

The pixel portion 4002, the signal line driver circuit 4003, and the scan line driver circuit 4004 that are provided over the substrate 4001 have a plurality of transistors. In FIG. 13B, transistors 4008 and 4009 included in the signal line driver circuit 4003 and a transistor 4010 included in the pixel portion 4002 are shown.

In addition, reference numeral 4011 denotes a light-emitting element, which is electrically connected to a transistor 4010.

A leading wiring 4014 corresponds to a wiring for supplying a signal or a power supply voltage to the pixel portion 4002, the signal line driver circuit 4003, and the scan line driver circuit 4004. The leading wiring 4014 is connected to a connecting terminal 4016 through a leading wiring 4015. The connecting terminal 4016 is electrically connected to a terminal of an FPC 4018 through an anisotropic conductive film 4019.

As the substrate 4001, in addition to glass, metal (typically, stainless), and ceramics, a flexible as typified by a plastic can be used. As the plastic, an FRP (Fiberglass-Reinforced Plastics) board, a PVF (polyvinylfluoride) film, a Mylar film, a polyester film, or an acrylic resin film can be used. A sheet that has a structure of aluminum foil sandwiched between PVF films or Mylar films can also be used. As the covering material 4006, a light-transmitting material such as a glass plate, a plastic plate, a polyester film, or acrylic film is used.

Adjacent to the covering material 4006, a color filter 4017 that has a coloring layer 4012 and a shielding film 4013 is formed. Of light emitted from the light-emitting element 4011, light in a specific wavelength range is selectively extracted through the coloring layer 4012.

As the filling material 4007, in addition to an inert gas such as nitrogen or argon, ultraviolet curable resin or a thermosetting resin such as PVC (polyvinyl chloride), acrylic, polyimide, epoxy resin, silicone resin, PVB (polyvinyl butyral), or EVA (ethylene vinyl acetate) can be used. In the present embodiment, nitrogen is used as the filling material.

Further, in order to expose the filling material 4007 to a hygroscopic material (preferably, barium oxide) or a material that can absorb oxygen, a side of the covering material 4006, facing the substrate 4001, may have a concavo portion 4007 provided to arrange a hygroscopic material or a material that can absorb oxygen.

Embodiment 8

A light-emitting device according to the present invention is high in color purity and is high in light extraction efficiency for the power consumption, and the contrast of an image can be enhanced. Therefore, clear images can be displayed while suppressing power consumption even when the light-emitting device is irradiated with outside light such as sunlight, which has the big advantage that the light-emitting device can be used relatively without selecting a place for the use of the light-emitting device. Accordingly, the light-emitting device is appropriate for devices such as portable electronic devices, in addition to a television.

Figure 14A:
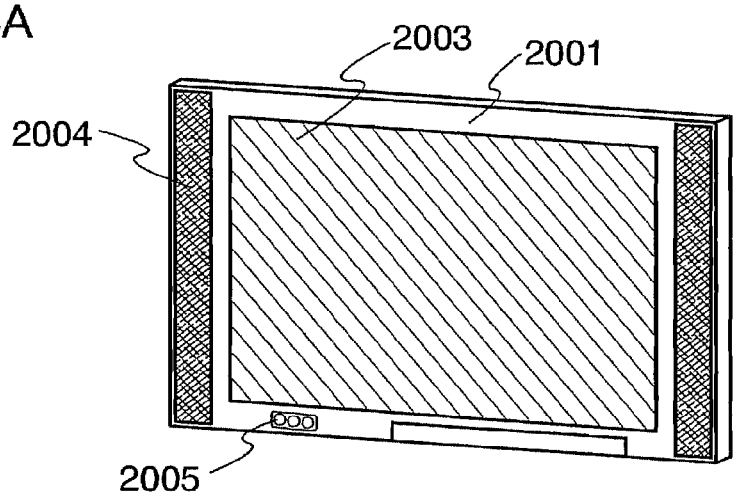
FIGS. 14A to 14C are diagrams of electronic devices using a light-emitting device according to the present invention.
Figure 14B:
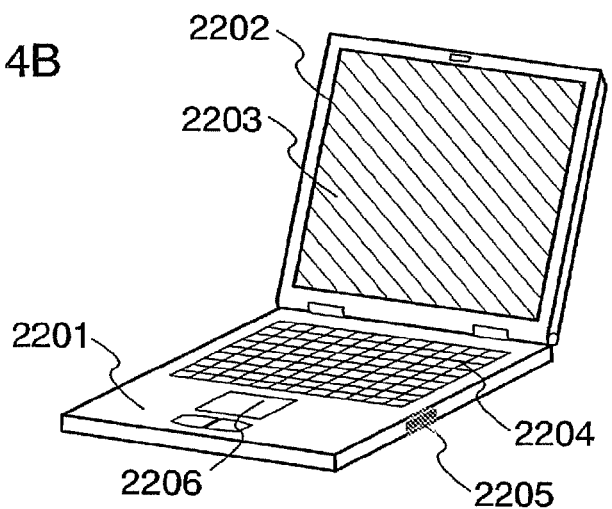
Figure 14C:
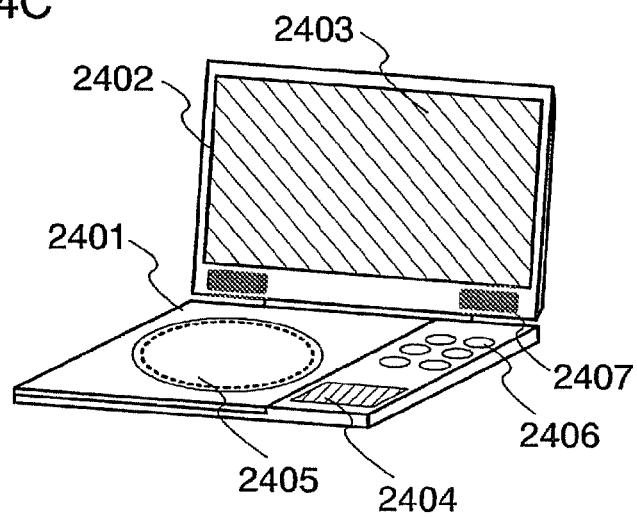

Specifically, electronic devices using a light-emitting device according to the present invention include a video camera, a digital camera, a goggle-type display (head mount display), a navigation system, a sound reproduction device (such as an in-car audio system or an audio set), a laptop personal computer, a game machine, a personal digital assistant (such as a mobile computer, a cellular phone, a portable game machine, or an electronic book), an image reproduction device equipped with a recording medium (specifically, a device equipped with a display device that is able to reproduce a recording medium such as a digital versatile disc (DVD) and display the image) can be given. FIGS. 14A to 14C show specific examples of these electronic devices.

FIG. 14A is a display device, which includes a frame body 2001, a display portion 2003, a speaker portion 2004, and a video input terminal 2005. The display device according to the present invention is completed by using a light-emitting device according to the present invention for the display portion 2003. The light-emitting device needs no backlight so that the display portion can be made thinner than a liquid crystal display. The display device includes all devices for displaying information such as for a personal computer, for receiving TV broad casting, and for displaying an advertisement.

FIG. 14B is a laptop personal computer, which includes a main body 2201, a frame body 2202, a display portion 2203, a keyboard 2204, an external connection port 2205, and a pointing mouse 2206. The image reproduction device according to the present invention is completed by using a light-emitting device according to the present invention for the display portion 2203.

FIG. 14C is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, and a speaker portion 2407. The display portion A 2403 is used mainly for displaying image information while the display portion B 2404 is used mainly for displaying character information. The image reproduction device equipped with the recording medium also includes a home game machine. The laptop personal computer according to the present invention is completed by using a light-emitting device according to the present invention for the display portion A 2403 and the display portion B 2404.

As described above, the present invention is quite widely applied, and can be used for electric devices in all fields. In addition, the electronic devices in the present invention may use a light-emitting device that has any of the structures described in Embodiments 1 to 7.

This application is based on Japanese Patent Application serial no. 2003-346053 filed in Japan Patent Office on 3, October 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting device comprising:
a first substrate;
a transistor comprising a gate electrode over the first substrate;
a first insulating layer;
a first pixel electrode over the first insulating layer;
a second pixel electrode over the first insulating layer;
a first electroluminescent layer over the first pixel electrode;
a second electroluminescent layer over the second pixel electrode;
a conductive layer over the first electroluminescent layer and the second electroluminescent layer;
a shielding film over a second substrate; and
a first coloring layer and a second coloring layer over the shielding film and the second substrate;
wherein an enclosed space formed by the first substrate and the second substrate is filled with a resin,
wherein a first light-emitting element comprises the first pixel electrode, the first electroluminescent layer, and a part of the conductive layer,
wherein a second light-emitting element comprises the second pixel electrode, the second electroluminescent layer, and another part of the conductive layer, wherein a color of light emitted from the first light-emitting element is different from a color of light emitted from the second light-emitting element, wherein a color of the first coloring layer is different from a color of the second coloring layer, wherein the first coloring layer overlaps with the first light-emitting element, wherein the second coloring layer overlaps with the second light-emitting element, wherein both of the first electroluminescent layer and the second electroluminescent layer overlap with the gate electrode, and wherein the shielding film overlaps with the gate electrode.

2. The light-emitting device according to claim 1, wherein each of the first light-emitting element and the second light-emitting element further comprises a layer comprising a metal oxide selected from molybdenum oxide, vanadium oxide, ruthenium oxide, and tungsten oxide.

3. A light-emitting device comprising:
a first transistor comprising a first gate electrode;
a second transistor comprising a second gate electrode;
a first light-emitting element that emits red light;
a second light-emitting element that emits green light;
a third light-emitting element that emits blue light; and
a color filter,
wherein the color filter comprises a first coloring layer that selectively transmits red light, a second coloring layer that selectively transmits green light, and a third coloring layer that selectively transmits blue light,
wherein the first to third light-emitting elements respectively correspond to the first to third coloring layers,
wherein each of the first to third light-emitting elements has a first electrode, an electroluminescent layer formed on the first electrode, and a second electrode formed on the electroluminescent layer,
wherein the electroluminescent layer of the second light-emitting element overlaps with the electroluminescent layer of the first light-emitting element and the first gate electrode, and
wherein the electroluminescent layer of the second light-emitting element overlaps with the electroluminescent layer of the third light-emitting element and the second gate electrode.

4. The light-emitting device according to claim 3, wherein the first electrode serves as a cathode and the second electrode serves as an anode, and a transparent conductive film is used as the second electrode.

5. The light-emitting device according to claim 4, wherein the transparent conductive film comprises one of indium tin oxide, indium tin oxide containing silicon, and indium zinc oxide.

6. The light-emitting device according to claim 3,
wherein the electroluminescent layer comprises a layer in contact with the second electrode, and
wherein the layer comprises one or more of a benzoxazole derivative, tetracyanoquinodimethane, $FeCl_3$, $C_{60}$, and 2,3,5,6-tetrafluoro-7,7,8,8-tetracyanoquinodimethane.

7. The light-emitting device according to claim 3, wherein the first electrode serves as an anode and the second electrode serves as a cathode, and a transparent conductive film is used as the second electrode.

8. The light-emitting device according to claim 7, wherein the transparent conductive film comprises one of indium tin oxide, indium tin oxide containing silicon, and indium zinc oxide.

9. The light-emitting device according to claim 3,
wherein the electroluminescent layer comprises a layer in contact with the second electrode, and
wherein the layer comprises one or more of an alkali metal, an alkali earth metal, and a transition metal.

10. A light-emitting device comprising:
a first transistor comprising a first gate electrode;
a second transistor comprising a second gate electrode;
a first light-emitting element that emits red light;
a second light-emitting element that emits green light;
a third light-emitting element that emits blue light; and
a color filter,
wherein the color filter comprises a first coloring layer, a second coloring layer, and a third coloring layer,
wherein the first to third light-emitting elements respectively correspond to the first to third coloring layers,
wherein a color purity of the red light which has a wide wavelength range is enhanced by the first coloring layer,
wherein a color purity of the green light which has a wide wavelength range is enhanced by the second coloring layer,
wherein a color purity of the blue light which has a wide wavelength range is enhanced by the third coloring layer,
wherein each of the first to third light-emitting elements has a first electrode, an electroluminescent layer formed on the first electrode, and a second electrode formed on the electroluminescent layer,
wherein the electroluminescent layer of the second light-emitting element overlaps with the electroluminescent layer of the first light-emitting element and the first gate electrode; and
wherein the electroluminescent layer of the second light-emitting element overlaps with the electroluminescent layer of the third light-emitting element and the second gate electrode.

11. The light-emitting device according to claim 10, wherein the first coloring layer selectively transmits light having the wavelength within a range of 610 nm to 750 nm.

12. The light-emitting device according to claim 10, wherein the second coloring layer selectively transmits light having the wavelength within a range of 500 nm to 560 nm.

13. The light-emitting device according to claim 10, wherein the third coloring layer selectively transmits light having the wavelength within a range of 435 nm to 480 nm.

14. The light-emitting device according to claim 10, wherein the first electrode serves as a cathode and the second electrode serves as an anode, and a transparent conductive film is used as the second electrode.

15. The light-emitting device according to claim 14, wherein the transparent conductive film comprises one of indium tin oxide, indium tin oxide containing silicon, and indium zinc oxide.

16. The light-emitting device according to claim 10,
wherein the electroluminescent layer comprises a layer in contact with the second electrode, and
wherein the layer comprises one or more of a benzoxazole derivative, tetracyanoquinodimethane, $FeCl_3$, $C_{60}$, and 2,3,5,6-tetrafluoro-7,7,8,8-tetracyanoquinodimethane.

17. The light-emitting device according to claim 10, wherein the first electrode serves as an anode and the second electrode serves as a cathode, and a transparent conductive film is used as the second electrode.

18. The light-emitting device according to claim 17, wherein the transparent conductive film comprises one of indium tin oxide, indium tin oxide containing silicon, and indium zinc oxide.

19. The light-emitting device according to claim 10,
wherein the electroluminescent layer comprises a layer in contact with the second electrode, and
wherein the layer comprises one or more of an alkali metal, an alkali earth metal, and a transition metal.

20. A light-emitting device comprising:
a transistor comprising a gate electrode;
a first light-emitting element;
a second light-emitting element; and
a color filter,
wherein the color filter comprises a first coloring layer and a second coloring layer,
wherein light in a first wavelength region of first light emitted from the first light-emitting element is extracted by the first coloring layer,
wherein light in a second wavelength region of second light emitted from the second light-emitting element is extracted by the second coloring layer,
wherein each of the first light-emitting element and the second light-emitting element has a first electrode, an electroluminescent layer formed on the first electrode, and a second electrode formed on the electroluminescent layer, and
wherein both of the electroluminescent layer of the second light-emitting element and the electroluminescent layer of the first light-emitting element overlap with the gate electrode.

21. The light-emitting device according to claim 20, wherein the first electrode serves as a cathode and the second electrode serves as an anode, and a transparent conductive film is used as the second electrode.

22. The light-emitting device according to claim 21, wherein the transparent conductive film comprises one of indium tin oxide, indium tin oxide containing silicon, and indium zinc oxide.

23. The light-emitting device according to claim 20,
wherein the electroluminescent layer comprises a layer in contact with the second electrode, and
wherein the layer comprises one or more of a benzoxazole derivative, tetracyanoquinodimethane, $FeCl_3$, $C_{60}$, and 2,3,5,6-tetrafluoro-7,7,8,8-tetracyanoquinodimethane.

24. The light-emitting device according to claim 20, wherein the first electrode serves as an anode and the second electrode serves as a cathode, and a transparent conductive film is used as the second electrode.

25. The light-emitting device according to claim 24, wherein the transparent conductive film comprises one of indium tin oxide, indium tin oxide containing silicon, and indium zinc oxide.

26. The light-emitting device according to claim 20,
wherein the electroluminescent layer comprises a layer in contact with the second electrode, and
wherein the layer comprises one or more of an alkali metal, an alkali earth metal, and a transition metal.

27. A light-emitting device comprising:
a transistor comprising a gate electrode;
a first light-emitting element;
a second light-emitting element; and
a color filter,
wherein the color filter comprises a first coloring layer and a second coloring layer,
wherein light in a first wavelength region of first light emitted from the first light-emitting element is extracted by the first coloring layer,
wherein light in a second wavelength region of second light emitted from the second light-emitting element is extracted by the second coloring layer,
wherein the extracted light has an enhanced color purity than each of the first or second light,
wherein each of the first light-emitting element and the second light-emitting element has a first electrode, an electroluminescent layer formed on the first electrode, and a second electrode formed on the electroluminescent layer, and
wherein both of the electroluminescent layer of the second light-emitting element and the electroluminescent layer of the second light-emitting element overlap with the gate electrode.

28. The light-emitting device according to claim 27, wherein the first electrode serves as a cathode and the second electrode serves as an anode, and a transparent conductive film is used as the second electrode.

29. The light-emitting device according to claim 28, wherein the transparent conductive film comprises one of indium tin oxide, indium tin oxide containing silicon, and indium zinc oxide.

30. The light-emitting device according to claim 27,
wherein the electroluminescent layer comprises a layer in contact with the second electrode, and
wherein the layer comprises one or more of a benzoxazole derivative, tetracyanoquinodimethane, $FeCl_3$, $C_{60}$, and 2,3,5,6-tetrafluoro-7,7,8,8-tetracyanoquinodimethane.

31. The light-emitting device according to claim 27, wherein the first electrode serves as an anode and the second electrode serves as a cathode, and a transparent conductive film is used as the second electrode.

32. The light-emitting device according to claim 31, wherein the transparent conductive film comprises one of indium tin oxide, indium tin oxide containing silicon, and indium zinc oxide.

33. The light-emitting device according to claim 27,
wherein the electroluminescent layer comprises a layer in contact with the second electrode, and
wherein the layer comprises one or more of an alkali metal, an alkali earth metal, and a transition metal.

34. A light-emitting device comprising:
a transistor comprising a gate electrode;
a first light-emitting element;
a second light-emitting element; and
a color filter,
wherein the color filter comprises a first coloring layer and a second coloring layer,
wherein a spectrum of first light emitted from the first light-emitting element is different from a spectrum of second light emitted from the second light-emitting element,
wherein light in a first wavelength region of the first light is extracted by the first coloring layer,
wherein light in a second wavelength region of the second light is extracted by the second coloring layer,
wherein each of the first light-emitting element and the second light-emitting element has a first electrode, an electroluminescent layer formed on the first electrode, and a second electrode formed on the electroluminescent layer, and
wherein both of the electroluminescent layer of the second light-emitting element and the electroluminescent layer of the first light-emitting element overlap with the gate electrode.

35. The light-emitting device according to claim 34, wherein the first electrode serves as a cathode and the second electrode serves as an anode, and a transparent conductive film is used as the second electrode.

36. The light-emitting device according to claim 35, wherein the transparent conductive film comprises one of indium tin oxide, indium tin oxide containing silicon, and indium zinc oxide.

37. The light-emitting device according to claim 34,
    wherein the electroluminescent layer comprises a layer in contact with the second electrode, and
    wherein the layer comprises one or more of a benzoxazole derivative, tetracyanoquinodimethane, $FeCl_3$, $C_{60}$, and 2,3,5,6-tetrafluoro-7,7,8,8-tetracyanoquinodimethane.

38. The light-emitting device according to claim 34, wherein the first electrode serves as an anode and the second electrode serves as a cathode, and a transparent conductive film is used as the second electrode.

39. The light-emitting device according to claim 38, wherein the transparent conductive film comprises one of indium tin oxide, indium tin oxide containing silicon, and indium zinc oxide.

40. The light-emitting device according to claim 34,
    wherein the electroluminescent layer comprises a layer in contact with the second electrode, and
    wherein the layer comprises one or more of an alkali metal, an alkali earth metal, and a transition metal.

\* \* \* \* \*